(12) United States Patent
Lee et al.

(10) Patent No.: US 10,181,438 B2
(45) Date of Patent: Jan. 15, 2019

(54) SEMICONDUCTOR SUBSTRATE MITIGATING BRIDGING

(71) Applicant: ADVANCED SEMICONDUCTOR ENGINEERING, INC., Kaosiung (TW)

(72) Inventors: Chun-Che Lee, Kaohsiung (TW);
Ming-Chiang Lee, Kaohsiung (TW);
Yuan-Chang Su, Kaohsiung (TW);
Tien-Szu Chen, Kaohsiung (TW);
Chih-Cheng Lee, Kaohsiung (TW);
You-Lung Yen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 57 days.

(21) Appl. No.: 14/523,733

(22) Filed: Oct. 24, 2014

(65) Prior Publication Data
US 2015/0115469 A1    Apr. 30, 2015

(30) Foreign Application Priority Data

Oct. 25, 2013  (CN) .......................... 2013 1 0512035

(51) Int. Cl.
*H01L 23/48*    (2006.01)
*H01L 23/52*    (2006.01)
(Continued)

(52) U.S. Cl.
CPC .... *H01L 23/49827* (2013.01); *H01L 21/4857* (2013.01); *H01L 23/49822* (2013.01); *H01L 23/49838* (2013.01); *H01L 23/49894* (2013.01); *H05K 1/113* (2013.01); *H05K 3/007* (2013.01); *H01L 2224/16225* (2013.01); *H01L 2924/0002* (2013.01); *H05K 3/4682* (2013.01); *H05K 2201/09227* (2013.01);
(Continued)

(58) Field of Classification Search
CPC ............. H01L 23/481; H01L 21/76877; H01L 21/76802; H01L 2224/16225; H01L 2924/0002
USPC ......................................... 257/774, 778, 786
See application file for complete search history.

(56) References Cited

U.S. PATENT DOCUMENTS 8,415,796 B2 * 4/2013 Yamano .............. H01L 23/3114
257/734
8,476,754 B2 * 7/2013 Kodani ............. H01L 23/49811
174/261

(Continued)

FOREIGN PATENT DOCUMENTS

TW          I295550         4/2008

*Primary Examiner* — Duy T Nguyen
*Assistant Examiner* — Dilinh Nguyen
(74) *Attorney, Agent, or Firm* — Foley & Lardner LLP; Cliff Z. Liu

(57) ABSTRACT

A semiconductor substrate and a manufacturing method thereof are provided. The semiconductor substrate includes a dielectric layer, a circuit layer, a first protection layer and a plurality of conductive posts. The dielectric layer has a first surface and a second surface that are opposite to each other. The circuit layer is embedded in the dielectric layer and is exposed from the first surface. The first protection layer covers a portion of the first circuit layer and defines a plurality of holes that expose a remaining portion of the first circuit layer. The conductive posts are formed in the holes.

26 Claims, 26 Drawing Sheets

(51) Int. Cl.
*H01L 29/40* (2006.01)
*H01L 23/498* (2006.01)
*H05K 1/11* (2006.01)
*H05K 3/00* (2006.01)
*H01L 21/48* (2006.01)
*H05K 3/46* (2006.01)

(52) U.S. Cl.
CPC .............. *H05K 2201/09563* (2013.01); *H05K 2201/09772* (2013.01); *H05K 2201/10674* (2013.01)

(56) References Cited

U.S. PATENT DOCUMENTS

| | | | | |
|---|---|---|---|---|
| 2009/0283903 | A1* | 11/2009 | Park | H01L 24/03 257/737 |
| 2009/0321118 | A1* | 12/2009 | Kim | H01L 23/5389 174/260 |
| 2010/0319966 | A1* | 12/2010 | Liu | H05K 13/00 174/255 |
| 2012/0313243 | A1* | 12/2012 | Chang | H01L 24/19 257/738 |
| 2014/0084413 | A1* | 3/2014 | Chen | H01L 23/49822 257/528 |
| 2014/0124922 | A1* | 5/2014 | Kim | H01L 24/11 257/737 |
| 2014/0174810 | A1* | 6/2014 | Noh | H05K 3/0097 174/266 |

* cited by examiner

SEMICONDUCTOR SUBSTRATE MITIGATING BRIDGING

CROSS REFERENCE TO RELATED APPLICATIONS

This application claims the benefit of Chinese patent application No. 201310512035.9, filed on 25 Oct. 2013, the contents of which are incorporated herein by reference in their entireties.

BACKGROUND

1. Technical Field

The present disclosure relates to a semiconductor substrate and its manufacturing method; in particular, to a semiconductor substrate having an embedded circuit layer and its manufacturing method.

2. Description of the Related Art

A conventional semiconductor substrate is electrically connected to an electric contact (such as a solder ball) of an external circuit element through a pad. Pads of the semiconductor substrate are exposed to carry a chip. However, in this manner, two adjacent pads of the semiconductor substrate are easily bridged and short-circuited due to the solder ball of the external circuit element. The bridge problem in a semiconductor substrate with fine pitch could be serious.

SUMMARY

The present disclosure provides a semiconductor substrate and a method for manufacturing the same, which reduces bridge and short circuit formation in the semiconductor substrate.

According to one aspect of the present disclosure, a semiconductor substrate including a dielectric layer, a first circuit layer, a first protection layer and conductive posts is provided. The dielectric layer has a first surface and a second surface that are opposite to each other. The first circuit layer is embedded in the dielectric layer and is exposed from the first surface. The first protection layer covers a portion of the first circuit layer and defines holes that expose the remaining portion of the first circuit layer. Conductive posts are formed in the holes.

In one embodiment, the semiconductor substrate further includes an electrical contact layer formed on the second surface of the dielectric layer, and a second protection layer covering the second surface of the dielectric layer and exposing a portion of the electrical contact layer. A ratio of a thickness of the first protection layer to a thickness of the second protection layer may be in the range from 1.2 to 1.5.

According to another aspect of the present disclosure, a semiconductor substrate includes a semiconductor substrate, which includes a dielectric layer, a first circuit layer, a first protection layer, and a conductive post, The semiconductor structure also includes a semiconductor element including an electrical connecting element. The dielectric layer has a first surface and a second surface that are opposite to each other. The first circuit layer is embedded in the dielectric layer and is exposed from the first surface. The first protection layer covers a portion of the first circuit layer and defines a plurality of holes that expose the remaining portion of the first circuit layer. The conductive post is formed in one of the hole. The semiconductor element is coupled to the conductive post through the electrical connecting element.

According to one other aspect of the present disclosure, a method for manufacturing a semiconductor substrate is provided. The method includes providing a carrier, forming a conductive portion and a protection layer on the carrier, and forming a dielectric layer on the protection layer. The conductive portion includes a first circuit layer and a conductive post, the protection layer covers a lateral surface of the conductive post, and the first circuit layer is disposed on the protection layer and the conductive post. The dielectric layer covers the first circuit layer so that the first circuit layer is embedded in the dielectric layer.

According to one other aspect of the present disclosure, a method for manufacturing a semiconductor substrate is provided. The method includes: providing a substrate, which includes (a) a dielectric layer having a first surface and a second surface that are opposite to each other, and (b) a first circuit layer embedded in the dielectric layer and exposed from the first surface; forming a protection layer on the dielectric layer and the first circuit layer; forming a first hole in the first protection layer to expose a portion of the protection layer; and forming a conductive post and a pad concurrently, wherein the conductive post is disposed in the first hole and the pad is disposed on the conductive post.

According to one other aspect of the present disclosure, a manufacturing method for a semiconductor substrate is provided. The manufacturing method includes: providing a carrier; forming conductive posts on the carrier; forming a first protection layer that covers a lateral surface of the conductive posts wherein the first protection layer defines holes from which the conductive posts are exposed; forming a circuit layer on the first protection layer; forming a dielectric layer on the first protection layer, wherein the dielectric layer covers the circuit layer so that the circuit layer is embedded in the dielectric layer. The dielectric layer has a first surface and a second surface that are opposite to each other, and the first surface of the dielectric layer faces the first protection layer. The manufacturing method further includes: forming an electrical contact layer on the second surface of the dielectric layer; and forming a second protection layer that covers the second surface of the dielectric layer and the electrical contact layer, the second protection layer exposing a portion of the electrical contact layer. A difference between the volume of the first protection layer and the volume of the second protection layer is between 30% and 50%.

The scope of the present disclosure will be more apparent from the following detailed description taken in conjunction with the accompanying drawings.

DETAILED DESCRIPTION

Figure 1A:
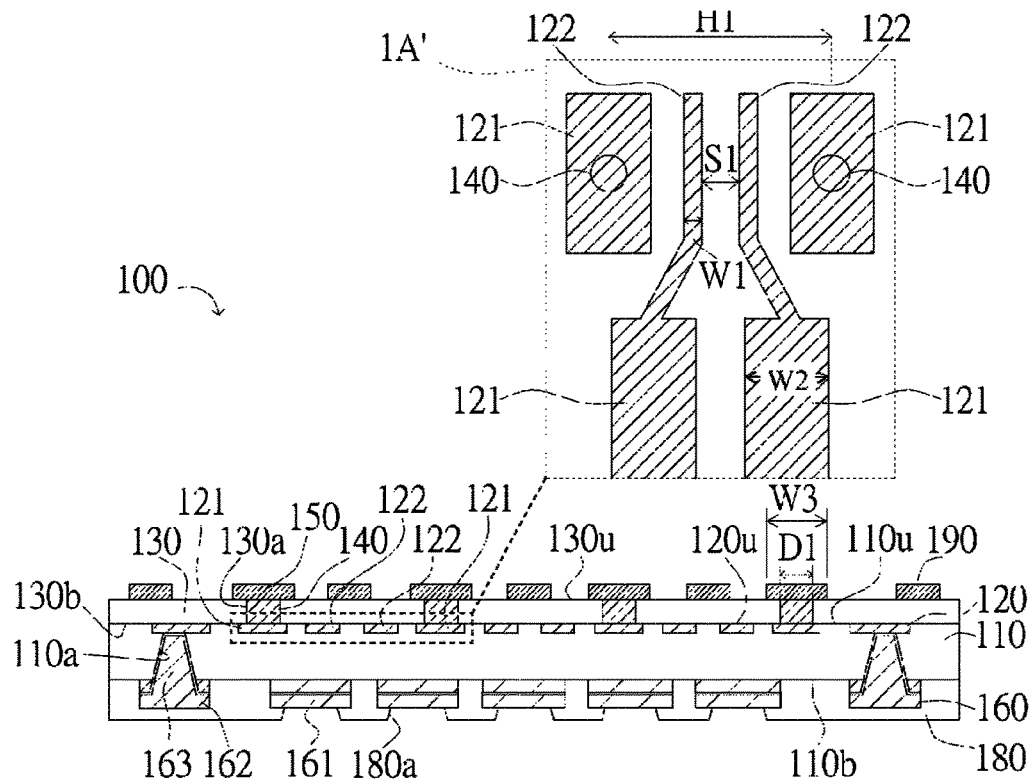
FIG. 1A is a sectional view of a semiconductor substrate according to an embodiment.

FIG. 1A is a sectional view of a semiconductor substrate according to an embodiment. A semiconductor substrate 100 includes a dielectric layer 110, a first circuit layer 120, a first protection layer 130, a plurality of first conductive posts 140, a plurality of input/output pads 150, an electrical contact layer 160, a second protection layer 180, and a reinforcing layer 190.

The dielectric layer 110 is made of, for example, polyimide (PI), a semi-cured sheet of epoxy glass fabric (e.g., prepreg (PP)), or Ajinomoto build-up film (ABF). The dielectric layer 110 has a first surface 110u and a second surface 110b that are opposite to each other.

The first circuit layer 120 is embedded in the dielectric layer 110 and is exposed from the first surface 110u. Specifically, an end surface 120u of the first circuit layer 120 is exposed from the first surface 110u of the dielectric layer 110. The end surface 120u of the first circuit layer 120 and the first surface 110u of the dielectric layer 110 are formed along a plane (such as a plane along the first surface 130b of the first protection layer 130). Therefore, the end surface 120u of the first circuit layer 120 is generally aligned with the first surface 110u of the dielectric layer 110, for example, the end surface 120u of the first circuit layer 120 is flush with the first surface 110u of the dielectric layer 110. The first surface 130b of the first protection layer 130 faces the first surface 110u of the dielectric layer 110. In one embodiment, the entire first circuit layer 120 is covered, by the first conductive posts 140 and the first protection layer 130, such that first circuit layer 120 is not exposed.

The first protection layer 130 is made of, for example, a solder resist layer, or a resin having a function of a solder resist layer. The first protection layer 130 covers a portion of the first circuit layer 120 and has a plurality of first holes 130a that expose the remaining portion of the first circuit layer 120. The first holes 130a are filled with the first conductive posts 140, so the first circuit layer 120 is covered by the first conductive posts 140 and the first protection layer 130; in other words, the first conductive posts 140 and the first protection layer 130 jointly overlie the entire first circuit layer 120.

The first conductive posts 140 are made of copper, an alloy thereof, or other materials with good electrical conductivity. The first conductive posts 140 are electrically connected to the first circuit layer 120 through the first holes 130a. In an embodiment of the present disclosure, the first holes 130a are filled with the first conductive posts 140, thereby pillar-like structures are formed. The first circuit layer 120 is electrically connected external to the semiconductor substrate through a plurality of first conductive posts 140 spaced at large intervals; therefore, when the first conductive posts 140 are in contact with electric contacts of another substrate (not shown) or another chip, the bridge problem can be avoided. In addition, the cross-sections of the first conductive posts 140 are in shapes such as circle, ellipse, or polygon.

The inset of FIG. 1A labeled 1A' is a top view of a partial enlargement of the first surface 110u of the dielectric layer 110 with embedded first circuit layer 120. The first circuit layer 120 includes a plurality of pads 121 electrically connected to the first conductive posts 140. A width W2 of each pad 121 for which there is a first conductive post 140 connected to the pad 121 is no less than (i.e., equal to or greater than) a diameter D1 of the first conductive post 140 connected to the pad 121; therefore, the pad 121 can cover the entire end surface of the first conductive post 140 even if the position of pad 121 slightly deviates from the designed position, thereby the quality of the electrical connection between the pad 121 and the first conductive post 140 can be improved. The first circuit layer 120 further includes a plurality of first conductive traces 122. A pad 121 is connected to a corresponding first conductive trace 122, and a corresponding first conductive post 140 may be formed on the pad 121. Some first conductive traces 122 are located between two adjacent pads 121. Although in this embodiment, two first conductive traces 122 located between two adjacent pads 121 are illustrated, it is not intended to limit the present disclosure thereto. Furthermore, in this embodiment, pads 121 are in a shape of rectangle. However, pads 121 may also have other shapes, such as a circle, an ellipse, or polygons other than rectangles. The first conductive posts 140 are insulated from adjacent first conductive traces 122 by the first protection layer 130; therefore, the risk of a bridge in a subsequent packaging process may be reduced and the design of the first circuit layer 120 can be more flexible.

Continuing to refer to inset 1A' of FIG. 1A, a pitch H1 between two pads 121 of the first circuit layer 120, and/or a line spacing S1 between two first conductive traces 122, can satisfy the definition of "fine pitch" or can be of smaller sizes, but manufacturing of the devices described in this disclosure is not restricted to a fine pitch process. The definition of "fine pitch" herein refers to: the pitch H1 is less than or equal to about 150 micrometers, and/or the line spacing S1 and/or line width W1 is less than or equal to about 20 micrometers. In one embodiment, because the first circuit layer 120 is not directly externally connected, for a given pitch H1 between two pads 121, the line width W1 and/or the line spacing S1 of the first conductive traces 122 can be increased. In this manner, the complexity of the design and the complexity related to processing in fine pitch is reduced, so that the reliability of the first circuit layer 120 is improved. In another embodiment, since the first circuit layer 120 is not directly externally connected, the pitch H1 between two pads 121 can be reduced along with reductions of one or both of the line width W1 and the line spacing S1 of the first conductive traces 122 remaining unchanged, such that the size of the semiconductor substrate 100 can be reduced. In yet another embodiment, the pitch H1 between two pads 121 can be reduced while the line width W1 and line spacing S1 of the first conductive traces 122 are increased, thereby achieving the technical effects of both.

Referring again to FIG. 1A, electrical contact layer 160 includes a plurality of input/output contacts 161, second conductive traces 162, and second conductive posts 163. The second conductive posts 163 can be formed, for example, by electroplating a conductive material within through holes 110a of the dielectric layer 110. The second conductive posts 163 are made of, for example, copper, an alloy thereof, or other materials that have good electrical conductivity. In addition, the second conductive posts 163 may be formed as a thin layer on an inner wall of the through hole 110a; or the second conductive posts 163 may be solid conductive posts that fill the entire through holes 110a.

Portions of the second conductive posts 163 extend from the second surface 110b of the dielectric layer 110 to the embedded first circuit layer 120 so as to be electrically connected to the first circuit layer 120. In this manner, an input/output pad 150 located at one side of the semiconductor substrate 100 may be connected, through a first conductive post 140, the first circuit layer 120, and a second conductive post 163, to the electrical contact layer 160 located at the opposite side of the semiconductor substrate 100.

The second protection layer 180 is made of, for example, a solder resist layer or a resin having a function of a solder resist layer; the second protection layer 180 covers the second surface 110b of the dielectric layer 110 and has at least one opening 180a. A part of the electrical contact layer 160 is exposed from the opening 180a of the second protection layer 180 and the remaining part of the electrical contact layer 160 is covered by the second protection layer 180. In one embodiment, the input/output contacts 161 are exposed, at least partially, from the opening 180a of the second protection layer 180, and the second conductive traces 162 are covered by the second protection layer 180. Since the input/output contacts 161 are at least partially exposed from the openings 180a, an external circuit element (not shown) can be electrically connected to the electrical contact layer 160 through the opening 180a. The second conductive traces 162 are not used as input/output pads and can therefore be covered by the second protection layer 180 so as to be protected by the second protection layer 180. In other embodiments, the second conductive traces 162 can be exposed from the second protection layer 180.

It should be noted that the electrical contact layer 160 protrudes from the second surface 110b of the dielectric layer 110 while the first circuit layer 120 is embedded in the first surface 110u of the dielectric layer 110. As a result, at least one of the geometric structures, the metal volumes, or the density of metal covering of two opposite sides of the semiconductor substrate 100 are asymmetric, such that the warpage of the semiconductor substrate 100 is increased. In one embodiment of the present disclosure, it has been found that the warpage of the semiconductor substrate 100 can be effectively reduced when a ratio of the thickness of the first protection layer 130 on the first circuit layer 120 to the thickness of the second protection layer 180 on the electrical contact layer 160 ranges from about 1.2 to about 1.5. In other embodiments, the ratio may be in range from about 1.2 to about 1.3, about 1.2 to about 1.4, about 1.3 to about 1.5, or about 1.4 to about 1.5. Controlling the thickness ratio as described reduces the cohesion difference between the first protection layer 130 and the second protection layer 180, thereby reducing the warpage of the semiconductor substrate.

In another embodiment of the present disclosure, it has been found that when a volume difference between the first protection layer 130 and the second protection layer 180 ranges from about 30% to about 50%, the warpage of the semiconductor substrate 100 can be reduced. In other embodiments, the volume difference may range from about 30% to about 35%, about 30% to about 40%, about 30% to about 45%, about 35% to about 40%, about 35% to about 45%, about 35% to about 50%, about 40% to about 45%, about 40% to about 50%, or about 45% to about 50%. Volume difference indicates |V1−V2|/V2 where V1 is the volume of the first protection layer 130, and V2 is the volume of the second protection layer 180.

Further, in an embodiment in which the first protection layer 130 does not fully cover the first circuit layer 120, or only covers a surrounding area (such as a chip-scale flip chip substrate) of the first surface 110u of the dielectric layer 110, the volume difference between the second protection layer 180 and the first protection layer 130 would be increased, and could even be increased to more than about 50% such that the cohesion difference between the protection layers (i.e., the first protection layer 130 and the second protection layer 180) at two opposite sides of the semiconductor substrate 100 would be increased, which results in the increase in warpage of the semiconductor substrate 100 Thus, in an embodiment of the present disclosure, the first protection layer 130 covers at least a part of the first circuit layer 120 such that the volume difference between the first protection layer 130 and the second protection layer 180 is within a specific range, thereby reducing the warpage of the semiconductor substrate 100.

The input/output pads 150 are formed on corresponding ones of the first conductive posts 140 so as to be electrically connected to the first circuit layer 120 through the first conductive post 140. Thus, the semiconductor substrate 100 may be stacked, such as in the form of a flip chip, on another substrate (not shown) or another chip, and the stacked devices electrically connected through the input/output pads 150. The shapes of the input/output pads 150 may be, for example, rectangle, circle, ellipse, or polygon other than rectangle, which can be designed to match the pattern of a pad of an external electronic element (such as a chip or another substrate). In addition, the width W3 of the input/output pads 150 is greater than the outer diameter D1 of the first conductive posts 140 so as to compensate for alignment error generated during subsequent electrical connection of the semiconductor substrate to another chip or another substrate.

The reinforcing layer 190 is formed on a second surface 130u of the first protection layer 130, where the second surface 130u faces a direction away from the first surface 110u of the dielectric layer 110. The reinforcing layer 190 and the input/output pads 150 may be formed in a same process stage, and their thickness may be generally the same. However, the thickness of the reinforcing layer 190 and the input/output pads 150 can be different. For example, the thickness of the reinforcing layer 190 can be greater than or less than the thickness of the input/output pads 150. The reinforcing layer 190 and the input/output pads 150 are electrically isolated from each other, and the reinforcing layer 190 does not have any circuit function. Alternatively, in another embodiment, the reinforcing layer 190 can be electrically connected to the input/output pads 150, to provide a circuit function (e.g., a signal transmission function).

The reinforcing layer 190 can reinforce the structural strength (rigidity) at the first surface 110u side of the dielectric layer 110 of the semiconductor substrate 100 so as to reduce the warpage of the semiconductor substrate 100. Further, if the volume of the first protection layer 130 were smaller than the volume of the second protection layer 180, the first surface 110u side of the dielectric layer 110 in FIG. 1A would have a smaller cohesion and thus would warp upward and become convex. The reinforcing layer 190 improves the strength at the first surface 110u side, thereby reducing the warpage of the semiconductor substrate 100. The reinforcing layer 190 is not limited to being formed at one side of the first protection layer 130. The reinforcing layer may also be formed at any side of the layers contained in the semiconductor substrate 100; therefore, the warpage of the semiconductor substrate 100 can be reduced by the strength of one or more reinforcing layers of the semiconductor substrate 100. In another embodiment of the present disclosure, the reinforcing layer 190 may be omitted.

Figure 1B:
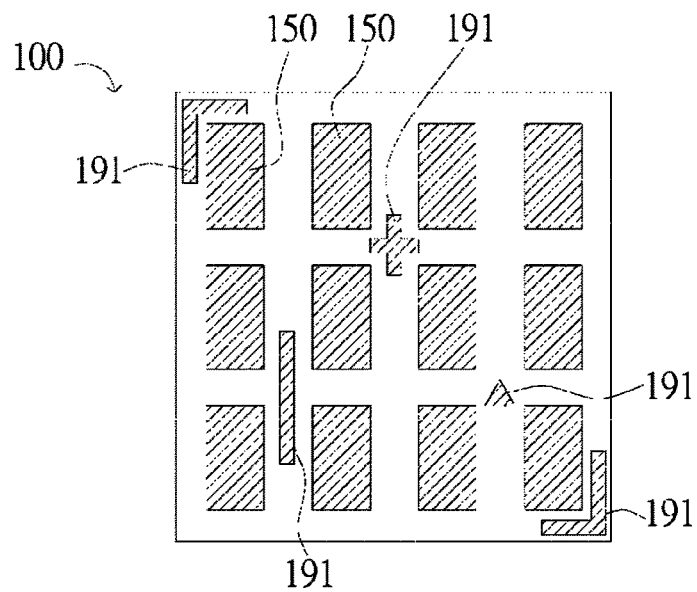
FIG. 1B is a top view of FIG. 1A.

FIG. 1B is a top view of FIG. 1A. A plurality of input/output pads 150 are arranged in an m×n array, where m may be equal to n, m may be greater than n, or m may be less than n. The reinforcing layer 190 includes at least one reinforcing structure 191, and the shape of the at least one reinforcing structure is, for example, a circle, an ellipse, a polygon, or other shape. In addition, the reinforcing structure 191 can extend along any path, for example, an L-shaped path or other open-loop path, or a closed-loop path, where a closed-loop path may be, for example, circular, elliptic, or polygonal. When the reinforcing structure 191 extends along a closed-loop path, the reinforcing structure 191 may be formed at the edge of the semiconductor substrate 100 and may surround some or all of the input/output pads 150.

Figure 2:
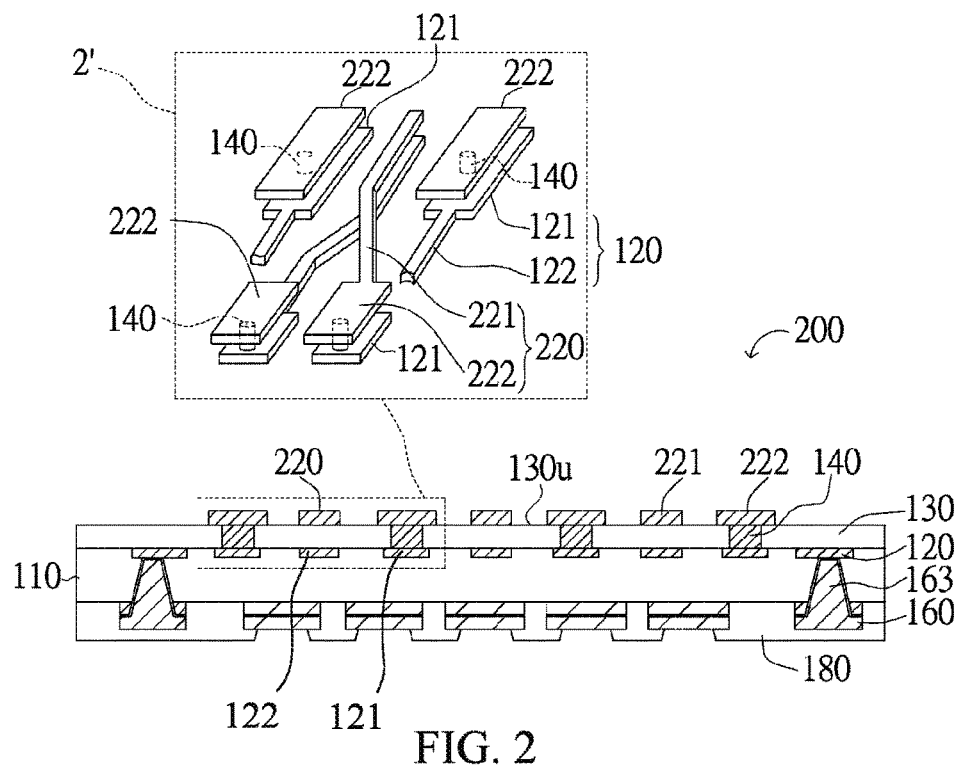
FIG. 2 is a sectional view of a semiconductor substrate according to another embodiment.

FIG. 2 is a sectional view of a semiconductor substrate according to another embodiment. A semiconductor substrate 200 includes a dielectric layer 110, a first circuit layer 120 including pads 121 and first conductive traces 122, a first protection layer 130, a plurality of first conductive posts 140, an electrical contact layer 160, a second protection layer 180, and a second circuit layer 220 including at least one third conductive trace 221 and input/output pads 222.

The second circuit layer 220 is formed on a second surface 130$u$ of the first protection layer 130 and is electrically connected to the first circuit layer 120 through the first conductive posts 140. The at least one third conductive trace 221 is located between two adjacent input/output pads 222 and is connected to a corresponding input/output pad 222. The input/output pads 222 of the second circuit layer 220 are electrically connected to respective ones of the pads 121 of the first circuit layer 120 through the first conductive posts 140.

Figure 8:
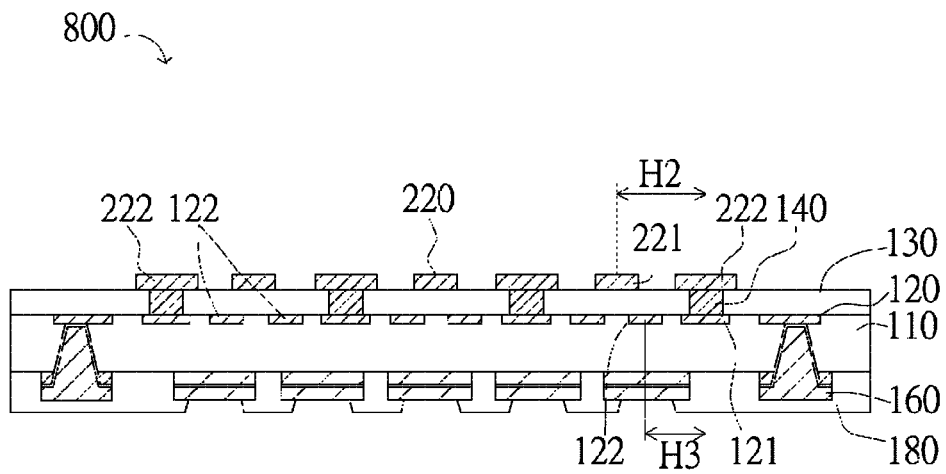
FIG. 8 is a sectional view of a semiconductor package according to another embodiment.

As shown in the top view of a partial enlargement 2' in FIG. 2, compared with the semiconductor substrate 100 in FIG. 1A, there are fewer first conductive traces 122 between two pads 121 in this embodiment, and the deficiency of the amount and/or function of first conductive traces 122 may be replenished by the second circuit layer 220. Further, compared with the embodiment shown in FIG. 1A, in which the circuit function is provided by the single first circuit layer 120, the embodiment of FIG. 2 implements the circuit function by using two circuit layers, i.e., an upper circuit layer and a lower circuit layer (i.e., the second circuit layer 220 and the first circuit layer 120). In another embodiment of the present disclosure, the second circuit layer 220 can provide another circuit function independent of the first circuit layer 120, which is shown in FIG. 8 and described below.

The number of first conductive traces 122 between two pads 121 may be reduced, and therefore the line width of the first conductive traces 122 can be designed to be wider, and as such is not restricted by a fine pitch process. Compared with the semiconductor substrate 100 in FIG. 1B, the second circuit layer 220 of the semiconductor substrate 200 in this embodiment provides a technical effect similar to that of the reinforcing layer 190, and therefore the warpage of the semiconductor substrate 100 is reduced. In another embodiment, if the second circuit layer 220 is not enough to reduce the warpage of the semiconductor substrate 100 to a required degree, the semiconductor substrate 200 may further include a reinforcing layer 190.

Figure 3:
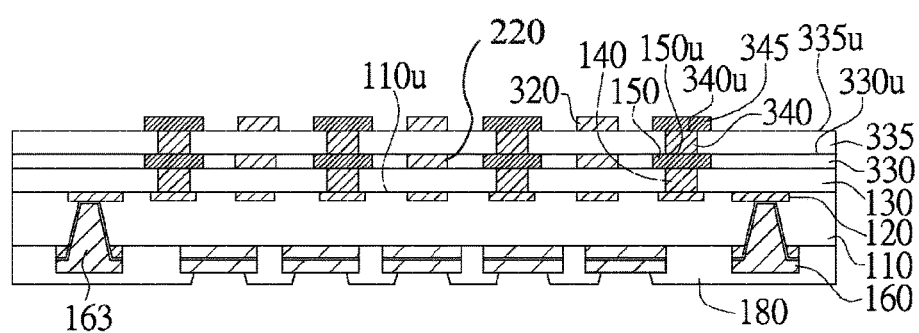
FIG. 3 is a sectional view of a semiconductor substrate according to another embodiment.

FIG. 3 is a sectional view of a semiconductor substrate according to another embodiment of the present disclosure. A semiconductor substrate 300 includes a dielectric layer 110, a first circuit layer 120, a first protection layer 130, a plurality of first conductive posts 140, a plurality of input/output pads 150, an electrical contact layer 160, a second protection layer 180, a second circuit layer 220 within a third protection layer 330, a fourth protection layer 335, a plurality of third conductive posts 340, a plurality of input/output pads 345, and a third circuit layer 320.

Compared with the semiconductor substrate 200 in FIG. 2, the semiconductor substrate 300 in this embodiment further includes a set of composite structure layers (e.g., third protection layer 330, fourth protection layer 335, third conductive posts 340, input/output pads 345, and third circuit layer 320) so as to provide more circuit functions. In addition, in another embodiment, the semiconductor substrate 300 may include two or more sets of such composite structure layers.

The third protection layer 330 covers the side surfaces of the input/output pads 150, and an end surface 150$u$ of each input/output pad 150 is exposed from a first surface 330$u$ of the third protection layer 330. The first surface 330$u$ of the third protection layer 330 faces away from the first surface 110$u$ of the dielectric layer 110. The end surfaces 150$u$ of the input/output pads 150 are generally aligned with the first surface 330$u$, for example, the end surfaces 150$u$ of the input/output pads 150 are flush with the first surface 330$u$. The third conductive posts 340 are formed on exposed end surfaces 150$u$ of respective input/output pads 150 so as to be electrically connected to the respective input/output pads 150.

The fourth protection layer 335 covers the side surfaces of the third conductive posts 340, and the end surfaces 340$u$ of the third conductive posts 340 are exposed from a first surface 335$u$ of the fourth protection layer 335. The first surface 335$u$ of the fourth protection layer 335 faces away from the first surface 110$u$ of the dielectric layer 110. The end surfaces 340$u$ of the third conductive posts 340 are generally aligned with the first surface 335$u$ of the fourth protection layer 335, for example, the end surfaces 340$u$ of the third conductive posts 340 are flush with the first surface 335$u$ of the fourth protection layer 335. The input/output pads 345 are formed on exposed end surfaces 150$u$ of respective third conductive posts 340 so as to be electrically connected to the respective third conductive posts 340.

The third circuit layer 320 is formed on the first surface 335$u$ of the fourth protection layer 335, and is electrically connected to the second circuit layer 220 through the third conductive posts 340. The third circuit layer 320 and the input/output pads 345 may be formed in the same process stage. In addition, a thickness of the third circuit layer 320 may be the same as, or different than, a thickness of the input/output pads 345.

Materials of the third circuit layer 320, the fourth protection layer 335, the third conductive posts 340, and the input/output pads 345 may be similar to those of the second circuit layer 220, the first protection layer 130, the first conductive posts 140, and the input/output pads 150, respectively, and thus are not described herein again.

In another embodiment, the semiconductor substrate 300 may further include a reinforcing layer 190 which is formed on the first surface 330$u$ of the third protection layer 330 and/or the first surface 335$u$ of the fourth protection layer 335.

Figure 4:
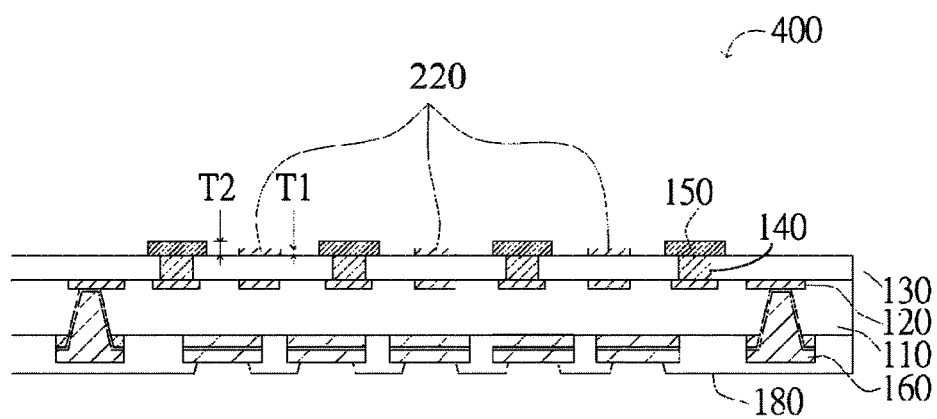
FIG. 4 is a sectional view of a semiconductor substrate according to another embodiment.

FIG. 4 is a sectional view of a semiconductor substrate according to another embodiment of the present disclosure.

A semiconductor substrate 400 includes a dielectric layer 110, a first circuit layer 120, a first protection layer 130, at least one first conductive post 140, a plurality of input/output pads 150, an electrical contact layer 160, a second protection layer 180, and a second circuit layer 220. In this embodiment, the thickness T1 of the second circuit layer 220 is less than the thickness T2 of the input/output pads 150, and by adjusting the thickness difference, the strength of the first protection layer 130 side of the semiconductor substrate 400 can be adjusted, thereby adjusting the warpage of the semiconductor substrate 400. In addition, thicker input/output pads 150 can also eliminate the risk of bridging during a subsequent electric connection to solder balls at a chip.

Figure 5:
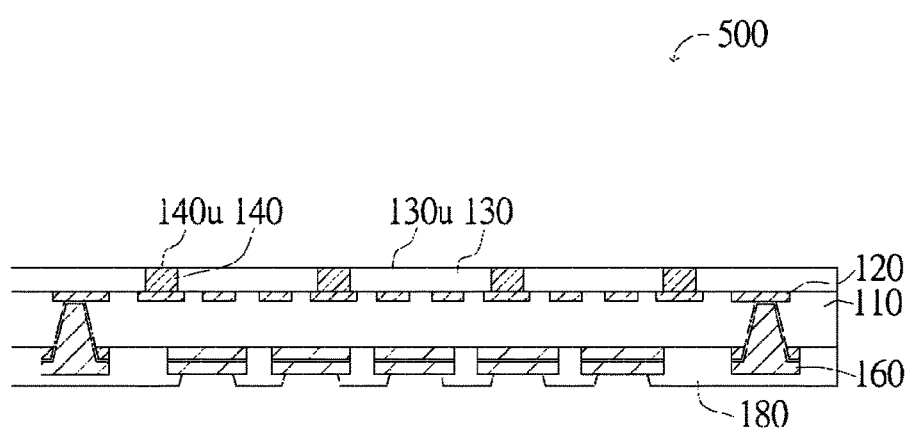
FIG. 5 is a sectional view of a semiconductor package according to another embodiment.

FIG. 5 is a sectional view of a semiconductor package according to another embodiment of the present disclosure. A semiconductor substrate 500 includes a dielectric layer 110, a first circuit layer 120, a first protection layer 130, at least one first conductive post 140, an electrical contact layer 160, and a second protection layer 180. Different from the semiconductor substrate 100 in FIG. 1A, the semiconductor package 500 of this embodiment omits the input/output pads 150 and the reinforcing layer 190.

End surfaces 140u of the first conductive posts 140 are generally aligned with a second surface 130u of the first protection layer 130, for example, an end surface 140u of a first conductive post 140 is flush with the second surface 130u of the first protection layer 130. The end surfaces 140u of the first conductive posts 140 are exposed from the second surface 130u of the first protection layer 130 so that a semiconductor element (not shown in FIG. 5) may be electrically connected to the semiconductor substrate 500 through the exposed end surface 140u.

Figure 6:
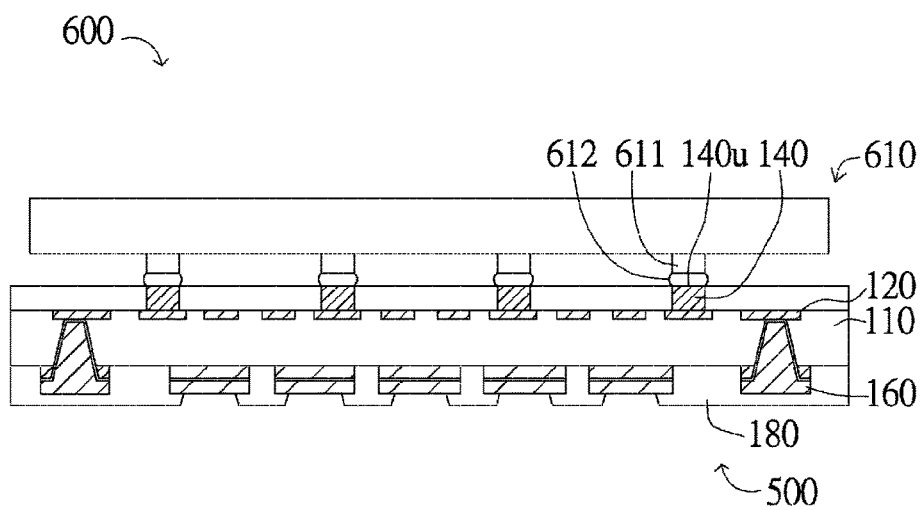
FIG. 6 is a sectional view of a semiconductor package according to another embodiment.

FIG. 6 is a sectional view of a semiconductor package according to another embodiment of the present disclosure. The semiconductor structure 600 includes a semiconductor element 610 and a semiconductor substrate 500; the semiconductor element 610 includes a plurality of electrical connecting elements 611. The electrical connecting elements 611 are, for example, conductive posts electrically connected to exposed end surfaces 140u of respective first conductive posts 140 through solder 612. The semiconductor element 610 is, for example, a semiconductor chip, a semiconductor package, a passive element, or a substrate.

The first circuit layer 120 is covered by the first protection layer 130, and therefore when the first conductive posts 140 are bound to an electric contact of another substrate (not shown) or of another chip, the bridge problem caused by electric connection of the first circuit layer to an adjacent first conductive trace 122 can be avoided.

Figure 7:
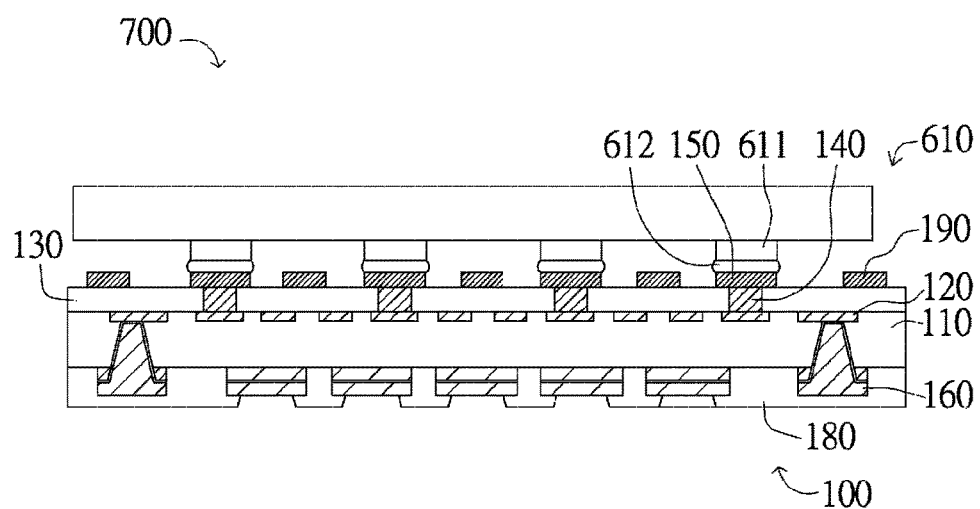
FIG. 7 is a sectional view of a semiconductor package according to another embodiment.

FIG. 7 is a sectional view of a semiconductor package according to another embodiment of the present disclosure. The semiconductor structure 700 includes a semiconductor element 610 and a semiconductor substrate 100. The semiconductor element 610 includes a plurality of electrical connecting elements 611. The semiconductor element 610 is coupled to the semiconductor substrate 100 through the electrical connecting elements 611. The electrical connecting elements 611 are electrically connected to respective exposed input/output pads 150 of the semiconductor substrate 100 through solder 612.

FIG. 8 is a sectional view of a semiconductor package according to another embodiment of the present disclosure. A semiconductor substrate 800 includes a dielectric layer 110, a first circuit layer 120, a first protection layer 130, at least one first conductive post 140, an electrical contact layer 160, a second protection layer 180, and a second circuit layer 220. Different from the semiconductor substrate 100 in FIG. 1A, the semiconductor substrate 800 omits the reinforcing layer 190 but includes the second circuit layer 220. However, in another embodiment, the semiconductor substrate 800 may include both the second circuit layer 220 and the reinforcing layer 190.

In the embodiment of FIG. 8, the conductive trace density between two input/output pads 222 is less than the conductive trace density between two pads 121, and therefore a pitch H2 between an input/output pad 222 and an adjacent third conductive trace 221 is greater than a pitch H3 between a pad 121 and an adjacent first conductive trace 122 of the first circuit layer 120. Although it is preferable to have a pitch H2 greater than a pitch H3, in another embodiment, the pitch H2 may be smaller than or equal to the pitch H3 if the distance between the input/output pad 222 and the adjacent third conductive trace 221 is modified when designing the circuit. In addition, with the design of different conductive trace densities of the upper and lower layers, the width of the third conductive traces 221 of the second circuit layer 220 may be greater than the width of the first conductive traces 122 of the first circuit layer 120. In another embodiment, the width of the third conductive traces 221 may be smaller than or equal to the width of the first conductive traces 122. With the design of the first circuit layer 120 and the second circuit layer 220, circuit functions of the semiconductor substrate 800 can be expanded.

Figure 9A:
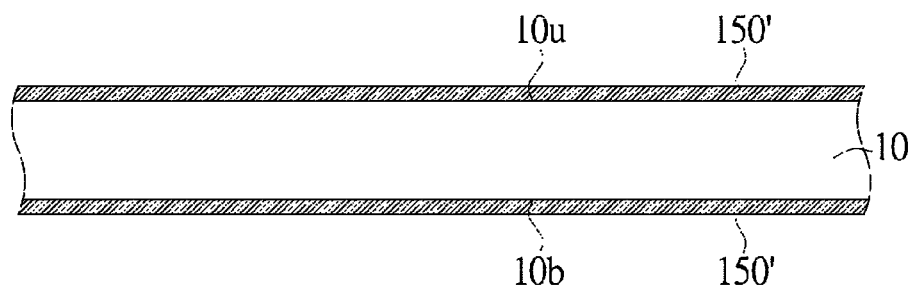
FIGS. 9A, 9B, 9C, 9D, 9E, 9F, 9G, 9H, 9I, 9J, 9K, 9L, 9M, 9N, 9O, 9P, and 9Q illustrate a method for manufacturing the semiconductor substrate of FIG. 1A according to one embodiment.
Figure 9B:
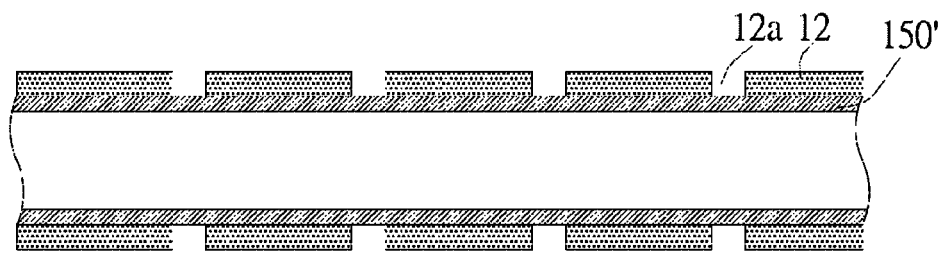
Figure 9C:
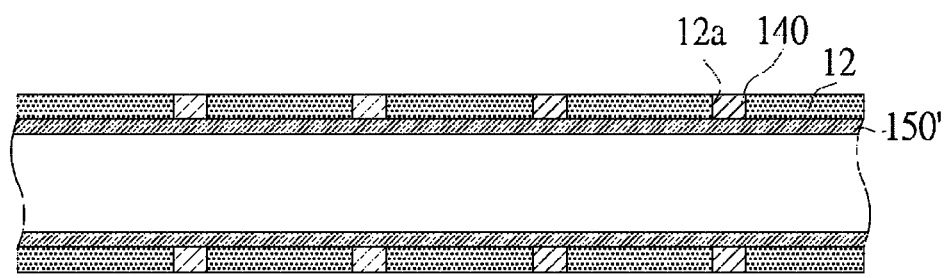
Figure 9D:
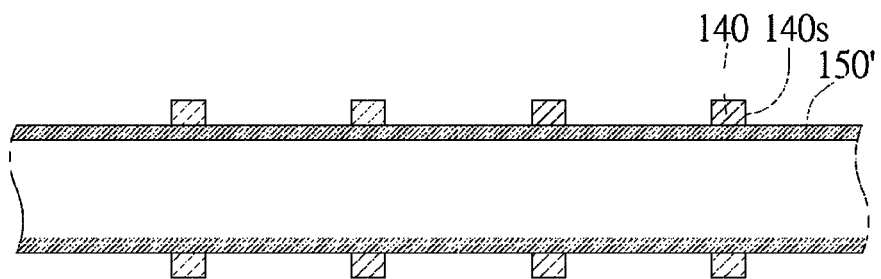
Figure 9E:
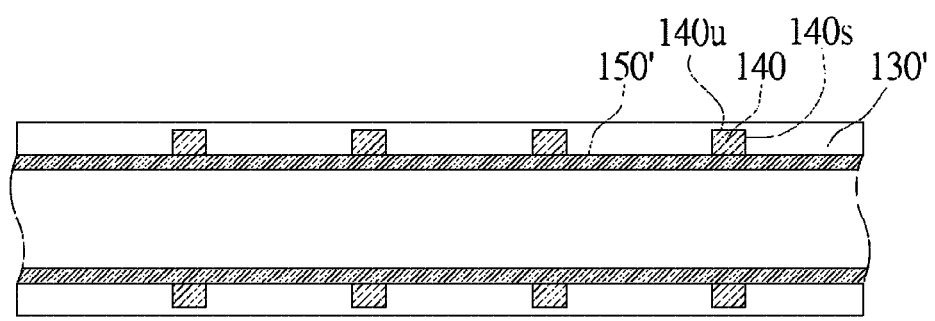
Figure 9F:
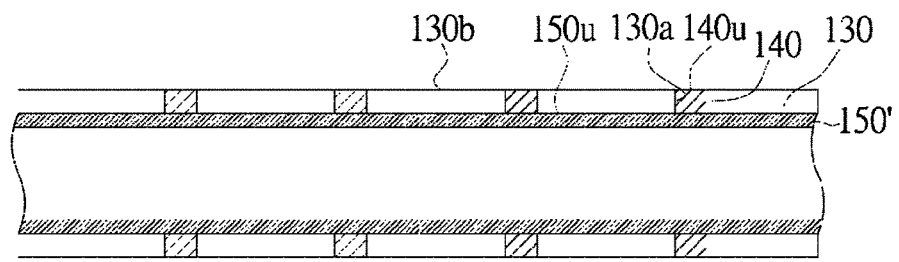
Figure 9G:
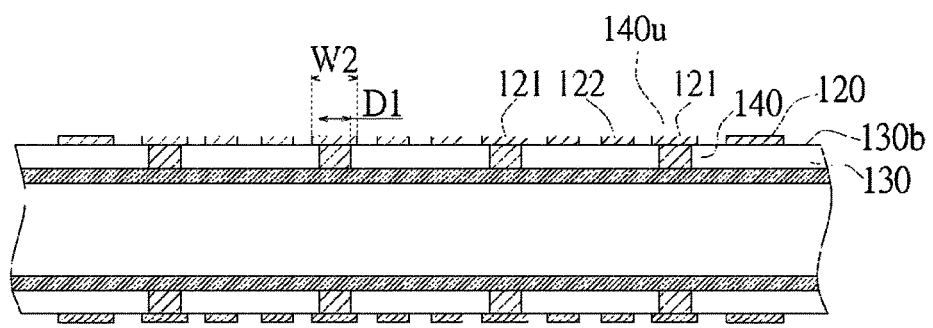
Figure 9H:
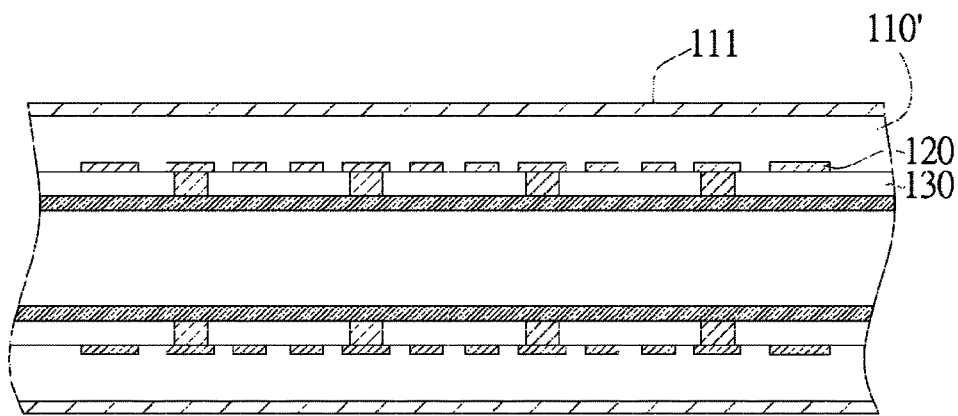
Figure 9I:
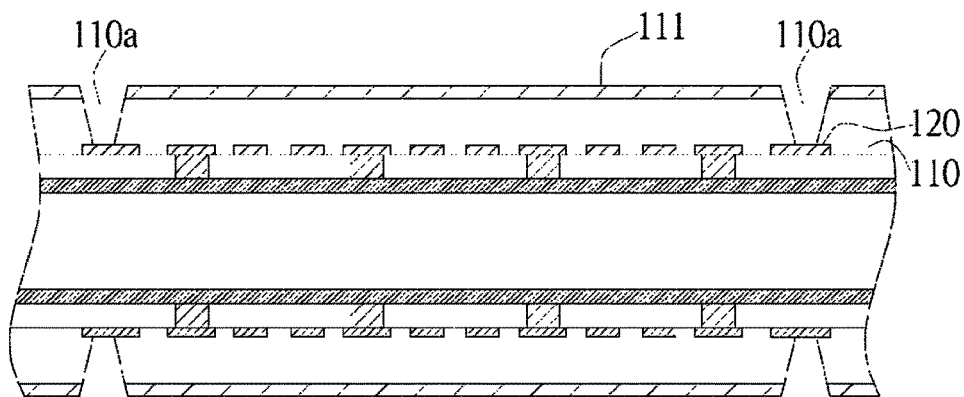
Figure 9J:
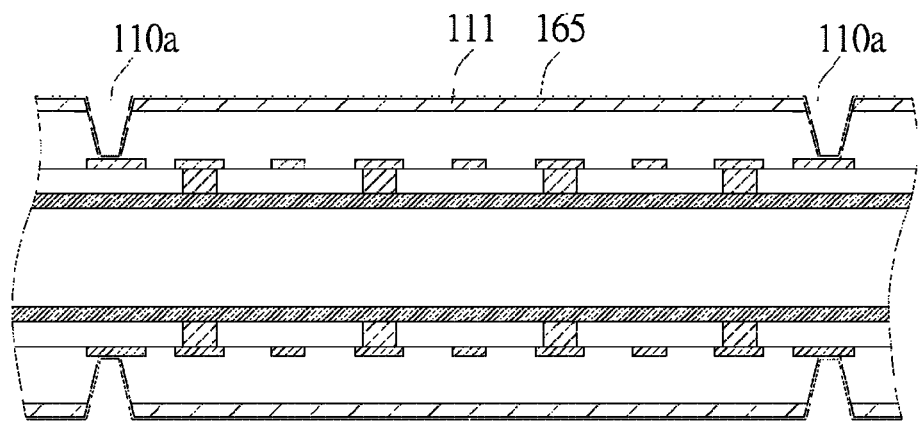
Figure 9K:
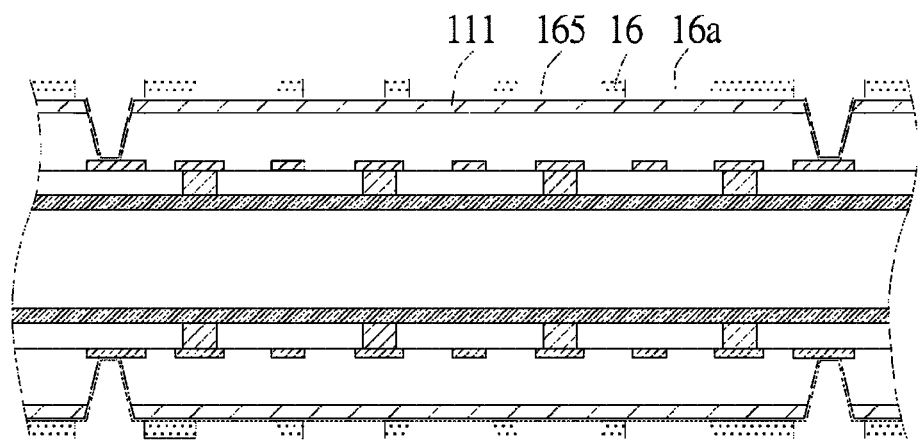
Figure 9L:
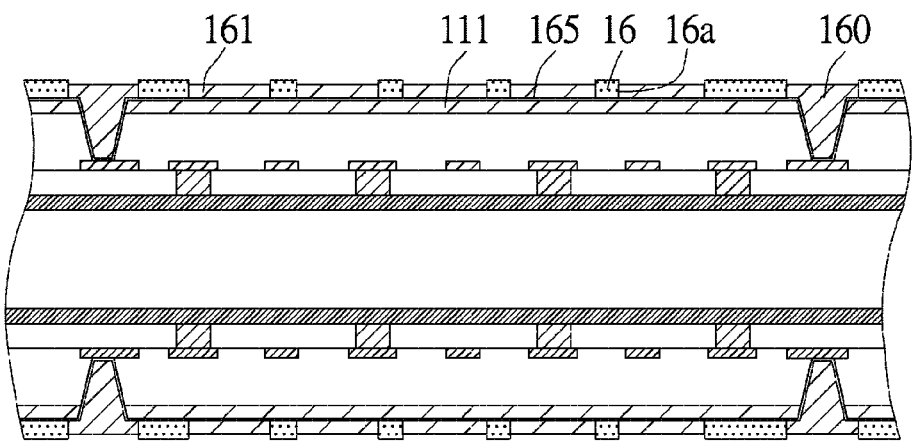
Figure 9M:
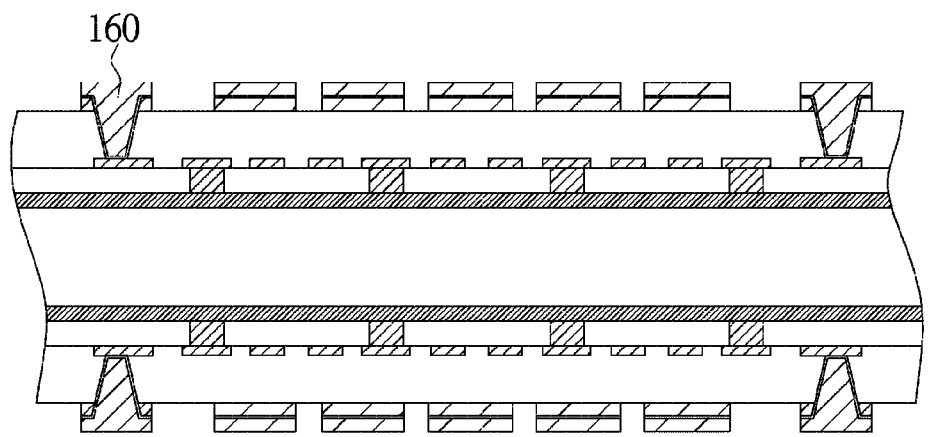
Figure 9N:
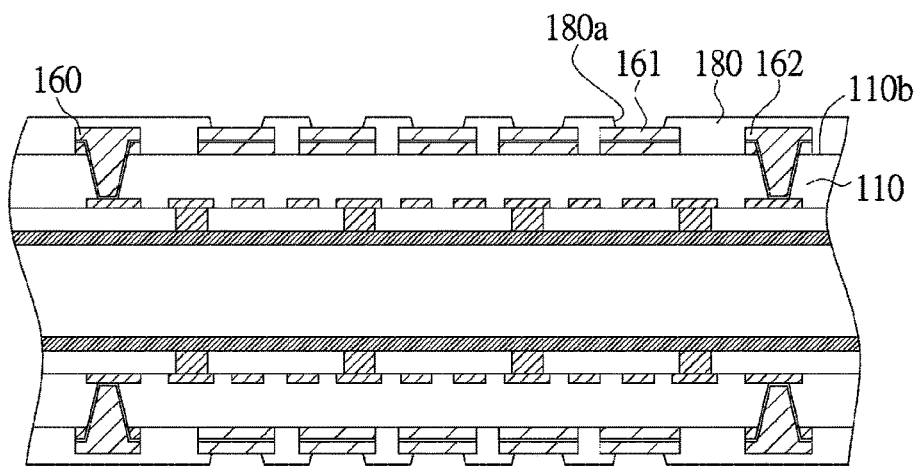
Figure 9O:
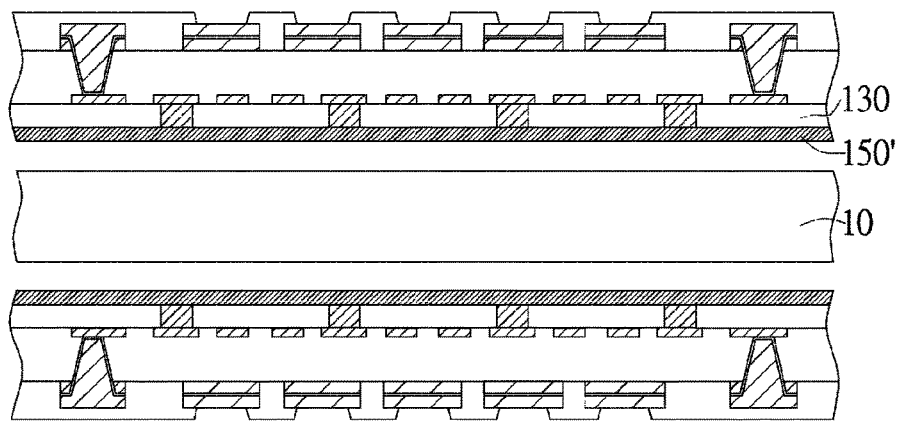
Figure 9P:
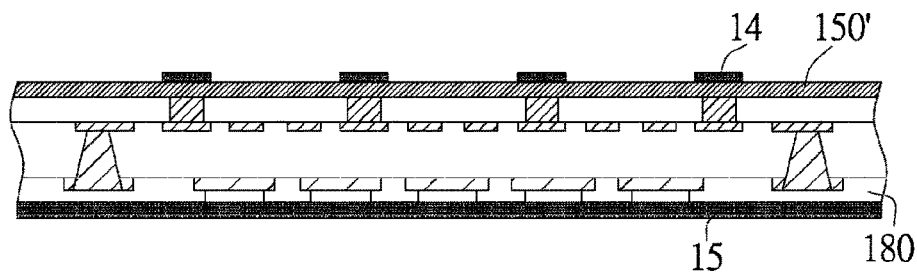
Figure 9Q:
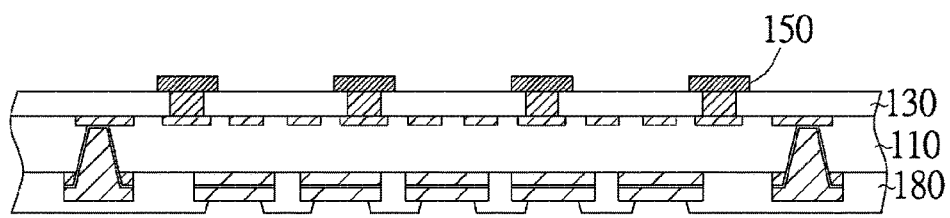

FIG. 9A to FIG. 9Q are diagrams of a method for manufacturing the semiconductor substrate shown in FIG. 1A.

As shown in FIG. 9A, a carrier 10 is provided. The carrier 10 includes an input/output pad material 150'. The input/output pad material 150' may be preformed, by using a material forming technology or an attaching method, on a first surface 10u and a second surface 10b of the carrier 10, the first surface 10u and the second surface 10b being opposite. The input/output pad material 150' is, for example, a metal layer made of copper, an alloy thereof or other conductive material. Specifically, the input/output pad material 150' may be a copper foil (Cu foil) or a copper layer (Cu layer). In addition, the thickness of the input/output pad material 150' is between about 20 micrometers (μm) and about 50 μm; for example, between about 20 μm and about 30 μm, between about 20 μm and about 40 μm, between about 30 μm and about 40 μm, between about 30 μm and about 50 μm, or between about 40 μm and about 50 μm.

The material forming technology is, for example, chemical vapor deposition, electroless plating, electrolytic plating, printing, spinning, spraying, sputtering, or vacuum deposition.

In the following steps, identical structures are formed on the first surface 10u and second surface 10b of the carrier 10 at the same time so as to improve the yield.

As shown in FIG. 9B, a patterned photoresist layer 12 that covers the input/output pad material 150' is formed by using, for example, a coating technology in combination with a patterning technology. The patterned photoresist layer 12 has a plurality of openings 12a, each of which defines an area of a first conductive post 140 (see FIG. 9C). In addition, the patterned photoresist layer 12 is, for example, a dry film.

The coating technology is, for example, printing, spinning, or spraying. The patterning technology is, for example, photolithography, chemical etching, laser drilling, or mechanical drilling.

As shown in FIG. 9C, a plurality of first conductive posts 140 are formed in the holes 12a by using, for example, the foregoing material forming technology. The first conductive posts 140 are electrically connected to the input/output pad material 150' through the openings 12a. The openings 12a are filled with the first conductive posts 140, thereby a pillar-like structure is formed. In addition, the height of the first conductive posts 140 is between 20 µm and 30 µm.

As shown in FIG. 9D, the patterned photoresist layer 12 is removed by using, for example, a film stripping technology so as to expose a lateral surface 140s of the first conductive posts 140 and to expose the input/output pad material 150' not covered by the first conductive posts 140.

As shown in FIG. 9E, a first protection layer material 130' that covers end surfaces 140u and lateral surfaces 140s of the first conductive posts 140 and covers the input/output pad material 150' is formed by using, for example, a coating technology.

As shown in FIG. 9F, a part of the first protection layer material 130' (FIG. 9E) is removed by using, for example, a grinding technology, until the end surfaces 140u of the first conductive posts 140 are exposed, thereby forming first protection layer 130. The first protection layer 130 and the first conductive posts 140 jointly cover the entire first surface 150u of the input/output pad material 150'. The first protection layer 130 and the first conductive posts 140 form a complementary structure; in other words, the area occupied by the first protection layer 130 is where no first conductive post 140 is formed. In addition, after the grinding, a first surface 130b is formed on the first protection layer 130 and is generally aligned with the ground end surfaces 140u of the first conductive posts 140, for example, flush with the end surfaces 140u.

As shown in FIG. 9G, a first circuit layer 120 is formed by using, for example, the foregoing material forming technology in combination with the patterning technology on the exposed end surfaces 140u of the first conductive posts 140 and on the first surface 130b of the first protection layer 130. Specifically, in this embodiment, a seed layer is first sputtered on the first protection layer 130 and then a patterned photoresist layer (such as a dry film) is formed so as to define the area of the first circuit layer 120; subsequently, the first circuit layer 120 is formed by using, for example, an electroplating process. Because the first circuit layer 120 is defined by a patterned photoresist layer and is formed by electroplating, a smaller line width can be achieved.

The first circuit layer 120 includes a plurality of pads 121 and a plurality of first conductive traces 122. The pads 121 are formed on the end surfaces 140u of respective first conductive posts 140 so as to be electrically connected to the first conductive posts 140, while the first conductive trace 122 is extended on the first surface 130b of the first protection layer 130 (from the top view of the structure of FIG. 9G).

The width W2 of the pads 121 is greater than the outer diameter D1 of the first conductive posts 140, and therefore, even if the pads 121 deviates slightly from design, the pads 121 can still cover the entire or most of the end surfaces 140u of the respective first conductive posts 140, which ensures the electrical quality between the pads 121 and the first conductive posts 140.

As shown in FIG. 9H, a dielectric layer material 110' that covers the first circuit layer 120 is formed by using, for example, a lamination technology. Specifically, the dielectric layer material 110' that covers the first circuit layer 120 and the first protection layer 130 is formed by using, for example, the foregoing coating technology; then, after an electric plate 111 is adhered to the dielectric layer material 110', pressure and heat are applied to the dielectric layer material 110' through the electric plate 111 so that the dielectric layer material 110' is tightly fastened on the first protection layer 130. The electric plate may be made of copper, an alloy thereof or other conductive material. Specifically, the electric plate is a copper foil (Cu foil).

As shown in FIG. 9I, at least one through hole 110a that penetrates the electric plate 111 and the dielectric layer material 110' is formed by using, for example, a patterning technology so as to expose the first circuit layer 120. After patterning, a dielectric layer 110 containing a part of the through hole 110a is formed from the dielectric layer material 110'.

As shown in FIG. 9J, a seed layer 165 that covers the entire electric plate 111 and an inner side wall of the through hole 110a is formed by means of, for example, electroless plating.

As shown in FIG. 9K, a patterned photoresist layer 16 is formed on the seed layer 165, wherein the patterned photoresist layer 16 has a plurality of openings 16a which define the area of an electrical contact layer 160 (FIG. 9L). As shown in FIG. 9L, the electrical contact layer 160 may be formed on the seed layer 165 through the openings 16a of the patterned photoresist layer 16 and by using, for example, an electroplating process.

As shown in FIG. 9M, the patterned photoresist layer 16 is stripped off, and then the seed layer 165 and electric plate 111 that are not covered by the electrical contact layer 160 are removed by means of, for example, photoetching.

As shown in FIG. 9N, a second protection layer 180 that covers the second surface 110b of the dielectric layer 110 is formed by using, for example, a coating technology in combination with a patterning technology. The second protection layer 180 exposes a part of the electrical contact layer 160. Specifically, the second protection layer 180 has a plurality of openings 180a; an input/output contact 161 is exposed from the opening 180a, but a second conductive trace 162 is covered by the second protection layer 180. Since the input/output contacts 161 are exposed from the opening 180a, an external circuit element (not shown) can be electrically connected to the electrical contact layer 160 through the opening 180a. In addition, since the second conductive trace 162 is not used as an input/output pad, the second conductive trace 162 can be covered by the second protection layer 180 so as to be protected by the second protection layer 180.

As shown in FIG. 9O, the input/output pad material 150' and the carrier 10 are separated from each other so as to expose the input/output pad material 150'.

As shown in FIG. 9P, a patterned photoresist layer 14 can be formed on the input/output pad material 150' by using, for example, a coating technology in combination with a patterning technology. A coverage area of the patterned photoresist layer 14 defines the area of the input/output pad 150. In addition, a photoresist layer 15 can be formed on the second protection layer 180 by using, for example, a coating technology. The photoresist layer 15 is a complete photoresist layer that covers the entire second protection layer 180, thereby preventing the second protection layer 180 from damage caused in the subsequent patterning process.

As shown in FIG. 9Q, the input/output pad material 150' is patterned by using, for example, the foregoing patterning technology (including etching), so that a plurality of input/output pads 150 are formed from the input/output pad material 150'. The patterned photoresist layer 14 is then stripped off to expose the input/output pads 150.

A reinforcing layer 190, as shown in FIG. 1A, may then be formed on the first protection layer 130. After a singulation process, at least one semiconductor substrate 100, as shown in FIG. 1A, is formed. The singulation process is performed by using, for example, a cutter or laser.

FIG. 10A to FIG. 10F are diagrams of a method for manufacturing the semiconductor substrate shown in FIG. 2.

Figure 10A:
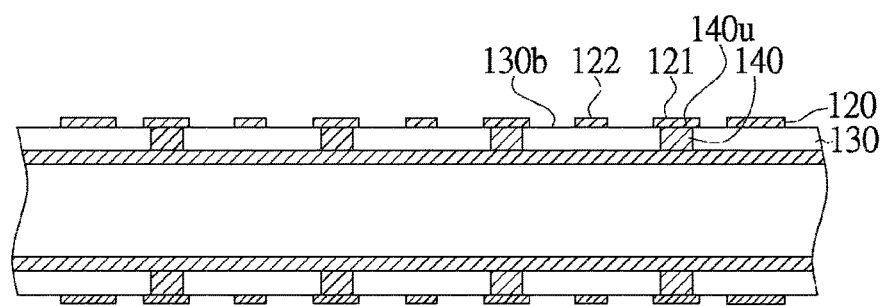
FIGS. 10A, 10B, 10C, 10D, 10E, and 10F illustrate a method for manufacturing the semiconductor substrate of FIG. 2 according to one embodiment.

As shown in FIG. 10A, a first circuit layer 120 is formed by using, for example, the foregoing material forming technology in combination with the patterning technology, on exposed end surfaces 140*u* of first conductive posts 140, and on a first surface 130*b* of a first protection layer 130. Specifically, in this embodiment, a conductive layer is first formed on the first protection layer 130 by means of panel plating, and then a patterned photoresist layer (not shown) is formed on the conductive layer to define the area of the first circuit layer 120. Then, the conductive layer is patterned by using the foregoing patterning technology to form the first circuit layer 120.

The first circuit layer 120 includes a plurality of pads 121 and a plurality of first conductive traces 122, wherein the pads 121 are formed on the end surfaces 140*u* of respective first conductive posts 140, and the first conductive traces 122 are extended on the first surface 130*b* of the first protection layer 130. When compared with the step in FIG. 9G, there are fewer first conductive traces 122 between two pads 121 in this embodiment, and the deficiency of the amount and/or function of first conductive traces 122 may be replenished by a second circuit layer 220 which is formed later.

Figure 10B:
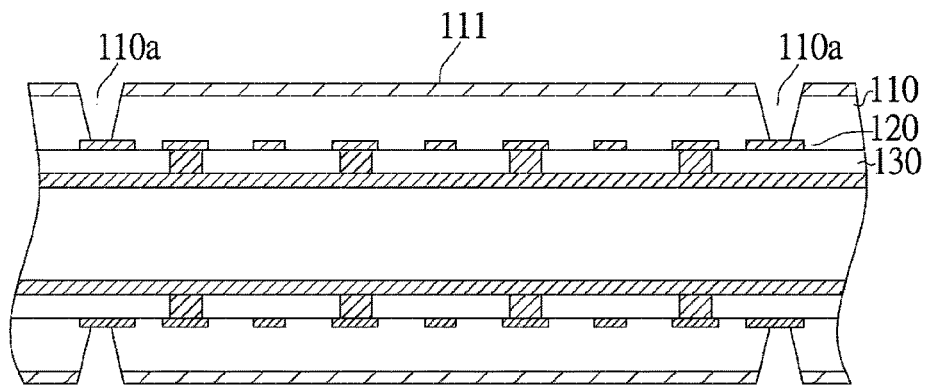

As shown in FIG. 10B, a dielectric layer 110 having at least one through hole 110*a* is formed by using, for example, a lamination technology in combination with a patterning technology, wherein the dielectric layer 110 covers the first protection layer 130 and the first circuit layer 120, and the through hole 110*a* penetrates through an electric plate 111 and the dielectric layer 110 so as to expose the first circuit layer 120.

Figure 10C:
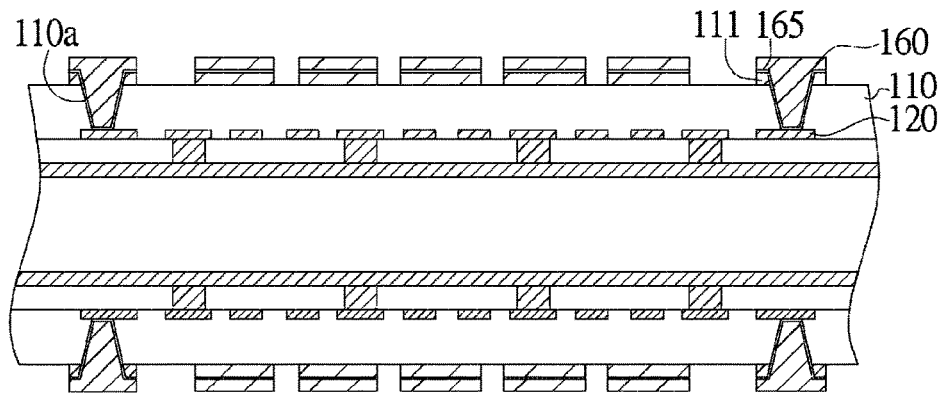

As shown in FIG. 10C, the electric plate 111, a seed layer 165, and an electrical contact layer 160 that are patterned and overlap each other are formed by using steps similar to the steps from FIG. 9J to FIG. 9M.

Figure 10D:
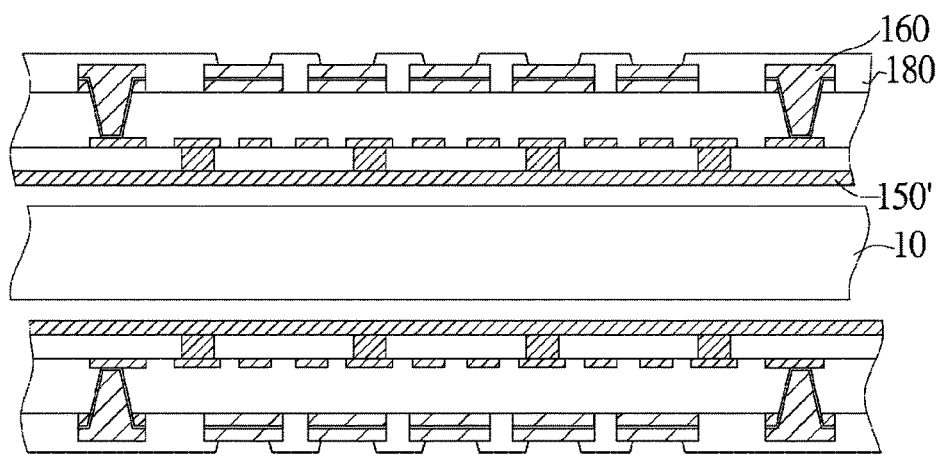

As shown in FIG. 10D, a second protection layer 180 that covers a second surface 110*b* of the dielectric layer 110 is formed by using, for example, a coating technology in combination with a patterning technology, and a part of the electrical contact layer 160 is exposed from the second protection layer 180. The input/output pad material 150' and the carrier 10 are then separated.

Figure 10E:
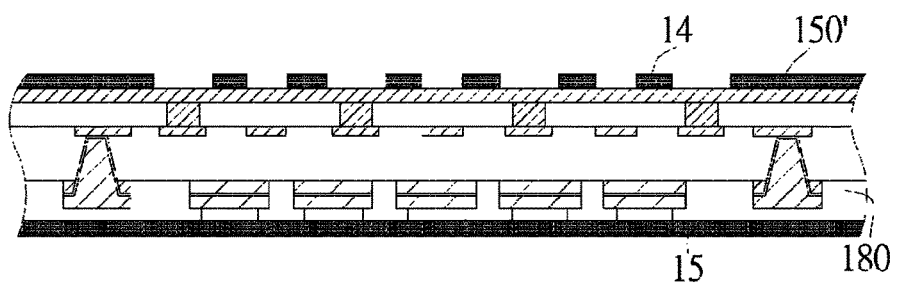

As shown in FIG. 10E, after the input/output pad material 150' and the carrier 10 are separated, a patterned photoresist layer 14 is formed on the input/output pad material 150' and a photoresist layer 15 is formed on the second protection layer 180 are formed by using, for example, a coating technology in combination with a patterning technology, where a coverage area of the patterned photoresist layer 14 defines the pattern of the second circuit layer 220, and the photoresist layer 14 covers the entire second protection layer 180.

Figure 10F:
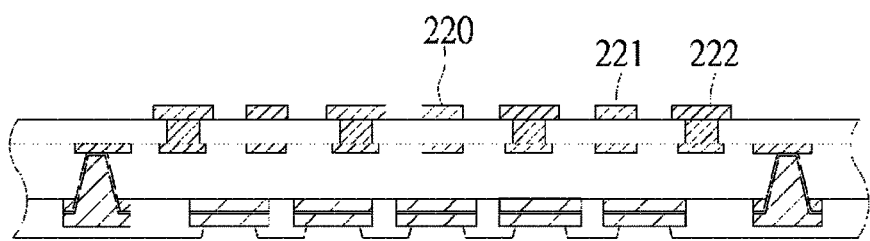

As shown in FIG. 10F, the input/output pad material 150' is patterned by using, for example, the foregoing patterning technology (such as etching) so as to form the second circuit layer 220. Then, the patterned photoresist layer 14 is removed so as to expose the second circuit layer 220. After a singulation process, at least one semiconductor substrate 200, as shown in FIG. 2, can be formed.

The method for manufacturing the semiconductor substrate 300 in FIG. 3 is similar to that for manufacturing the semiconductor substrate 200 in FIG. 2, and thus is not described herein again.

To manufacture the semiconductor substrate 400 in FIG. 4, instead of forming the second circuit layer 220 from the input/output pad material 150' (as in the step of FIG. 10F); after the formation of the input/output pad 150, the second circuit layer 220 is formed by using additional material forming technology in combination with a patterning technology so that the second circuit layer 220 is thinner than the input/output pad 150.

The method for manufacturing the semiconductor substrate 500 in FIG. 5 is similar to that for manufacturing the semiconductor substrate 100 in FIG. 1A; the difference lies in that the step for forming an input/output pad material 150' can be omitted.

The method for manufacturing the semiconductor structure 600 in FIG. 6 includes: stacking a semiconductor element 610 on the semiconductor substrate 500; and connecting electrical connecting element 611 of the semiconductor element 610 to respective exposed conductive posts 140 of the semiconductor substrate 500 through solder 612.

The method for manufacturing the semiconductor structure 700 in FIG. 7 includes: stacking a semiconductor element 610 on the semiconductor substrate 100; connecting electrical connecting elements 611 of the semiconductor element 610 to respective input/output pads 150 of the semiconductor substrate 100 through solder 612.

The method for manufacturing the semiconductor substrate 800 in FIG. 8 is similar to that for manufacturing the semiconductor substrate 200; the difference lies in that: in the step of FIG. 10A, two first conductive traces 122 are formed between two conductive posts 140.

FIG. 11A to FIG. 11K illustrate the steps in a method for manufacturing the semiconductor substrate according to one embodiment. This method is similar to that illustrated in FIG. 9A to FIG. 9Q, except for the steps of forming the first circuit layer, the first conductive post and the first protection layer.

Figure 11A:
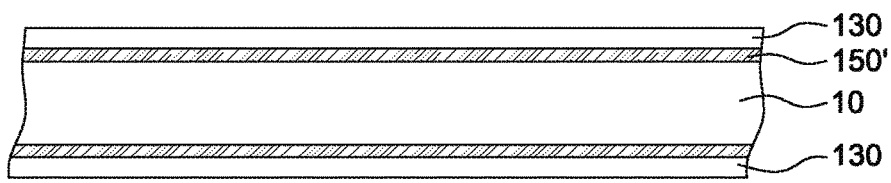
FIGS. 11A, 11B, 11C, 11D, 11E, 11F, 11G, 11H, 11I, 11J, and 11K illustrate a method for manufacturing the semiconductor substrate according to one embodiment.

Referring to FIG. 11A, a first metal layer (i.e., an input/output pad material 150') is applied to the carrier 10 according to the process of FIG. 9A, and then a first protection layer 130 is formed on the first metal layer.

Figure 11B:
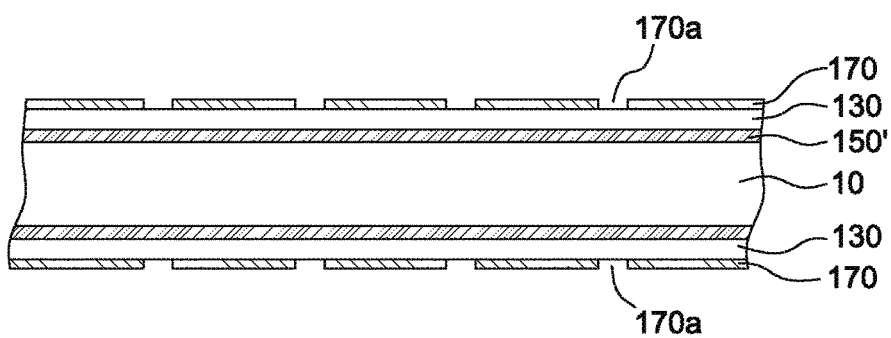

As shown in FIG. 11B, a second metal layer 170 having second holes 170*a* is formed on the first protection layer 130 such that the first protection layer is exposed through the second holes. The second metal layer may be made of copper, an alloy thereof or other conductive material. Specifically, the second metal layer is a copper foil (Cu foil) or a copper layer (Cu layer). The second metal layer may be preformed, by using a mask together with a material forming technology as described above, or by using an attaching method in which the second hole has been formed in a metal sheet before the metal sheet is attached to the first protection layer 130.

Figure 11C:
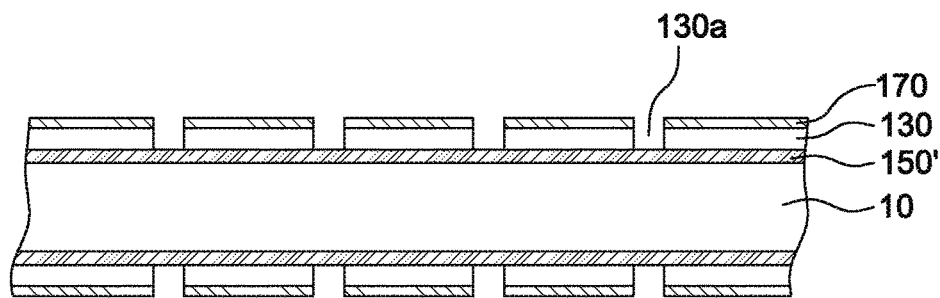

As shown in FIG. 11C, a first hole 130*a* is formed in the first protection layer 130 by laser drilling through the second hole of the second metal layer. In addition, by using laser drilling, the first hole 130*a* can be formed with a smaller diameter so the size of the first conductive post can be reduced.

Figure 11D:
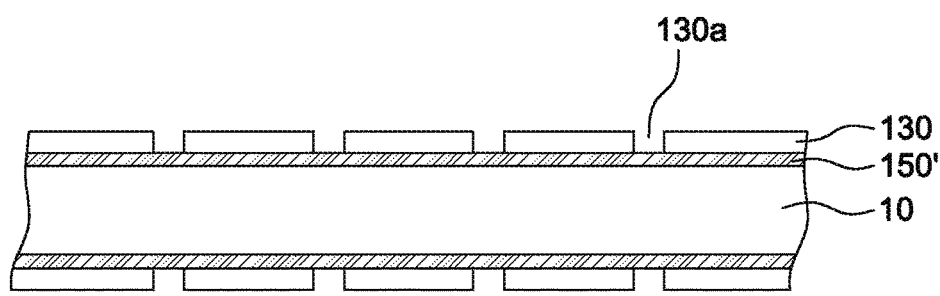

In another embodiment of the present disclosure, the first protection layer 130 can be made by applying a photosentive material to the first metal layer 150' and the first holes 130*a* can be formed in first protection layer 130 by photolithography (FIG. 11D). In this embodiment, the first holes 130*a* can also be formed with a smaller diameter so the size of the conductive posts filling the first holes 130*a* can be reduced.

FIG. 11E to FIG. 11J illustrate the detailed steps to form a first circuit layer 120 and first conductive posts 140.

Figure 11E:
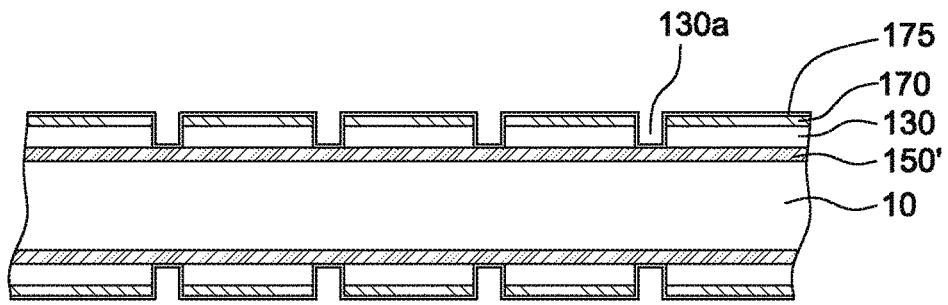
Figure 11F:
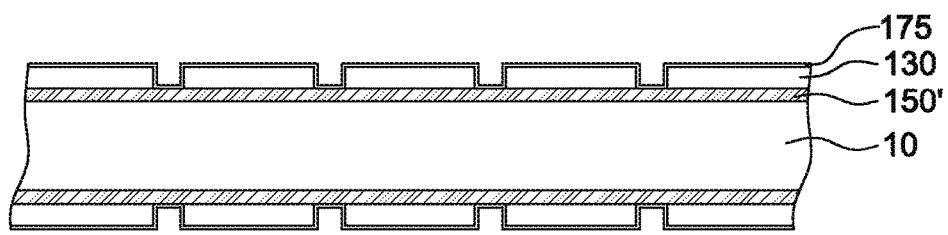

In FIG. 11E, a seed layer 175 is formed on the second metal layer 170 and in the inner side walls of the first holes 130a and the second holes 170a by means of, for example, electroless plating. In the case that a photosentive material is used to form the first protection layer 130 having a plurality of first holes 130a (FIG. 11D), a seed layer 175 is formed on the first protection layer 130 and in the inner side wall of the first holes 130a by means of, for example, electroless plating (FIG. 11F).

Figure 11G:
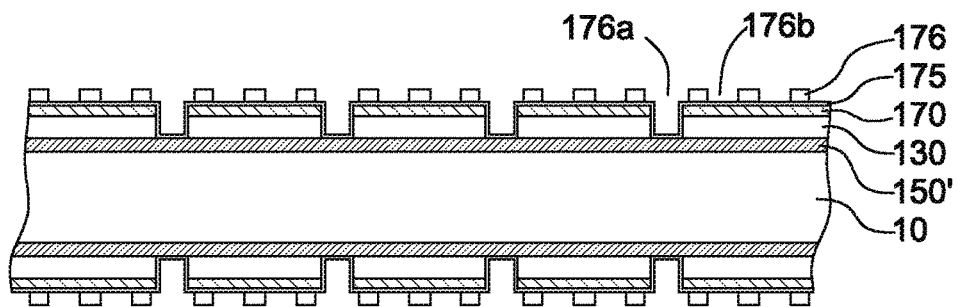

In FIG. 11G, a photoresist layer 176 is formed on the seed layer 175 by coating, printing or any other suitable technique and predetermined or selected portions of the photoresist layer 176 are photoimaged and developed so as to create openings 176a and 176b. Openings 176a and 176b expose a portion of the seed layer 175. The photoresist material may be a dry film photoresist, or another type of patternable layer or dielectric layer.

Figure 11H:
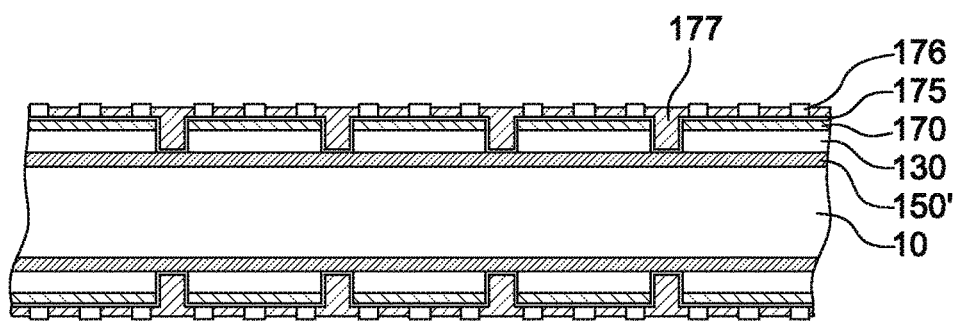

In FIG. 11H, a metal material 177 is formed on the exposed seed layer 175. The metal material may have similar characteristics to the material used for the input/output pad material 150', such as copper or an alloy of copper.

Figure 11I:
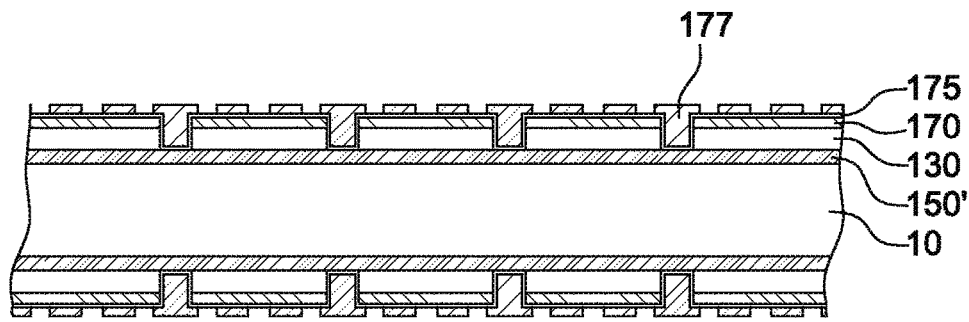
Figure 11J:
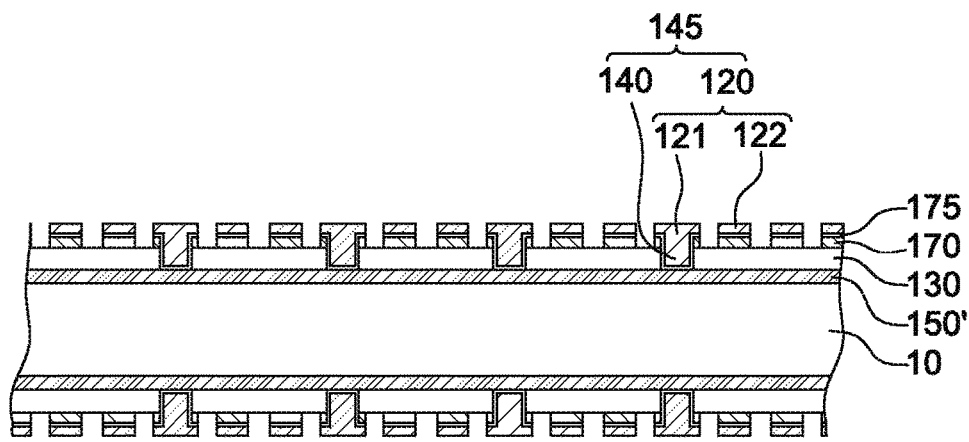

In FIG. 11I, the photoresist layer 176 is removed to expose additional portions of the seed layer 175, which are removed in the following step as shown in FIG. 11J. In FIG. 11J, the seed layer 175 and the second metal layer 170 that are not covered by the metal material 177 are removed by means of, for example, photoetching. After the above steps, a conductive layer 145 including a first circuit layer 120 and a first conductive post 140 is prepared.

As shown in FIG. 11E to FIG. 11J, the first circuit layer 120 including pads 121 and first conductive traces 122 is formed simultaneously with the first conductive posts 140. The pads 121 and the respective first conductive posts 140 connected thereto are formed integrally as a conductive portion of the semiconductor substrate, thereby the strength of the pads 121 and the first conductive posts 140 can be enhanced and the reliability of the semiconductor structure can be increased.

Figure 11K:
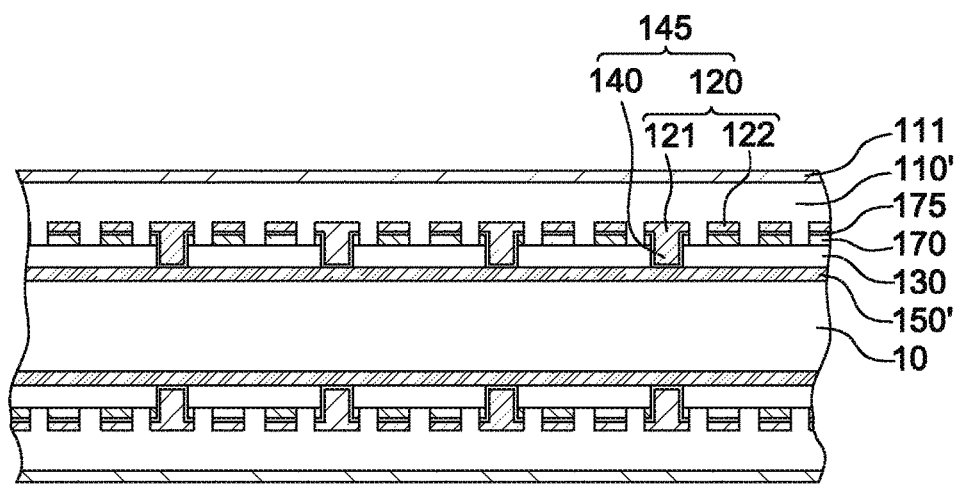

As shown in FIG. 11K, a dielectric layer material 110' that covers the first circuit layer 120 and the first protection layer 130 is formed by using, for example, a lamination technology. Same as the step shown in FIG. 9H, an electric plate 111 can be used so as to tightly fasten the dielectric layer material 110'.

The steps shown in FIG. 9I to FIG. 9N are applied to prepare a dielectric layer material 110 as well as an electrical contact layer 160 and a second protection layer on the dielectric layer material 110'.

Finally, the first metal layer (i.e., the input/output pad material 150') is separated from the carrier (by using the same step of FIG. 9O) and patterned to form input/output pads 150 (by using the same steps of FIGS. 9P and 9Q).

FIG. 12A to FIG. 12I are diagrams of the steps involved in a method for manufacturing the semiconductor substrate according to another embodiment.

Figure 12A:
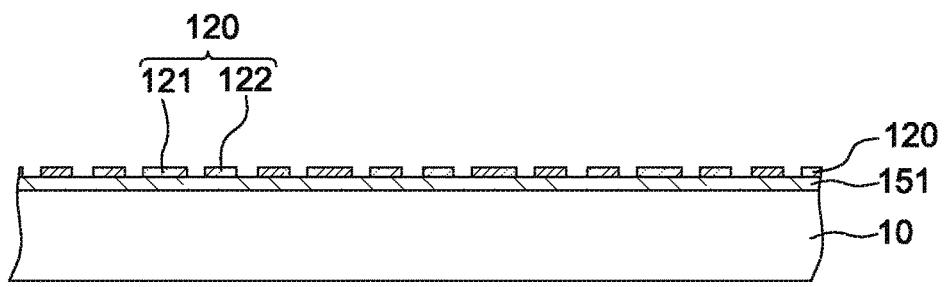
FIGS. 12A, 12B, 12C, 12D, 12E, 12F, 12G, 12H, and 12I illustrate a method for manufacturing the semiconductor substrate according to another embodiment.

As shown in FIG. 12A, a metal layer 151 is applied to a carrier 10. A first circuit layer including pads 121 and conductive traces 122 is formed on the carrier 10 or the metal layer 151 (if present) by using a patterned photoresist layer (not shown). The process to form and the material of the patterned photoresist layer are similar to those involved in FIG. 11G. The patterned photoresist layer is removed after the formation of the first circuit layer.

Figure 12B:
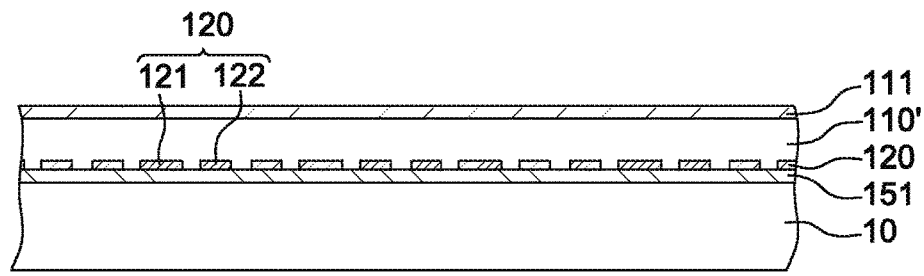

As shown in FIG. 12B, a dielectric layer material 110' is applied to cover the entire first circuit layer such that the first circuit layer is embedded in the dielectric layer. The process of applying the dielectric layer material 110' is same as that of FIG. 9H, and an electric plate 111 can be used so as to tightly fasten the dielectric layer material 110'.

Figure 12C:
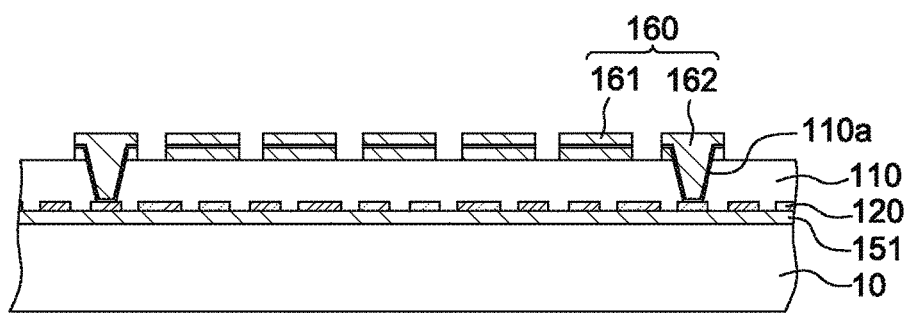

As shown in FIG. 12C, a dielectric layer 110 containing a through hole 110a is formed from the dielectric layer material 110' by using the same step as shown in FIG. 9I; and an electrical contact layer 160 containing an input/output contact 161 and a second conductive traces 162 is formed by using the same steps as shown in FIG. 9J to FIG. 9M.

Figure 12D:
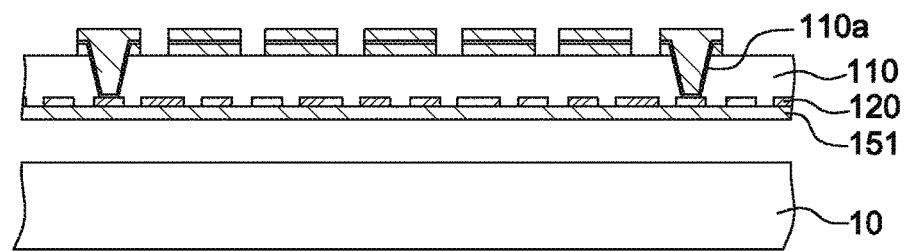
Figure 12E:
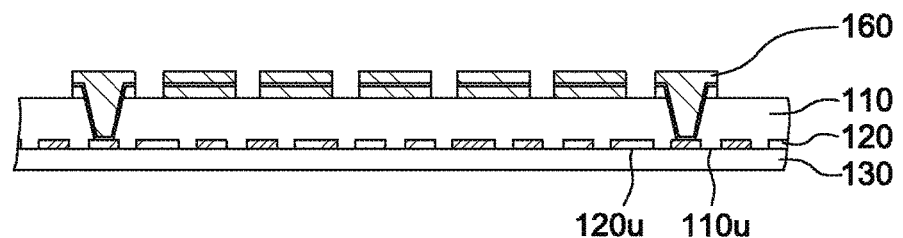

In FIG. 12D, a photoresist material (not shown) is applied to the electrical contact layer 160 and the dielectric layer 110 so as to protect them in the subsequent etching process. The carrier 10 is separated from the metal layer 151, the metal layer 151 is etched away, and the photoresist material is removed (FIG. 12E). As shown in FIG. 12E, after etching, an end surface 120u of the first circuit layer 120 and an end surface 110u of the dielectric 110 layer are exposed. The end surface 120u of the first circuit layer 120 may be aligned with the first surface 110u or the end surface 120u of the first circuit layer 120 may be recessed.

Figure 12F:
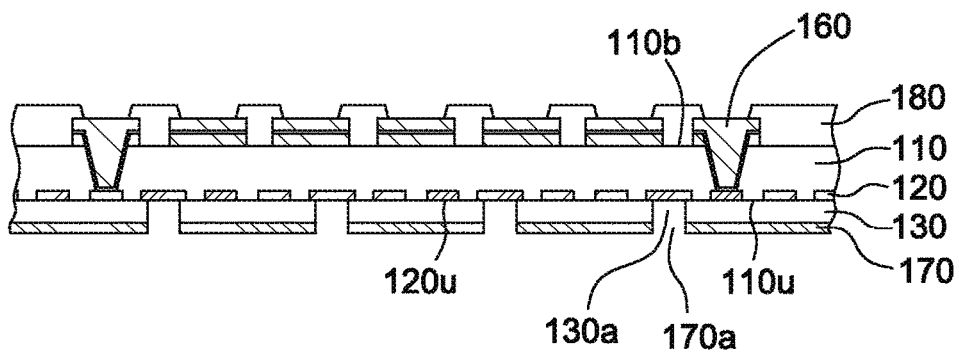

In FIG. 12F, a first hole 130a of the first protection layer 130 and a second hole 170a of a second metal layer 170 is formed by using the same steps as shown in FIG. 11B to FIG. 11C; and a second protection layer 180, which exposes a part of the electrical contact layer 160, is formed on the second surface 110b of the dielectric layer 110 by using the same step as shown in FIG. 9N.

Figure 12G:
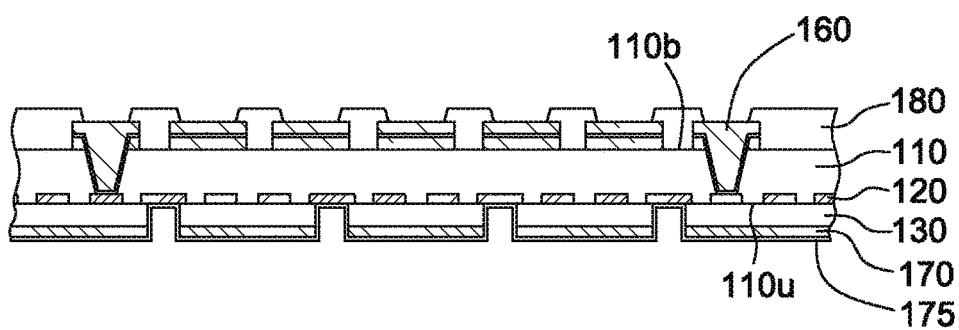
Figure 12H:
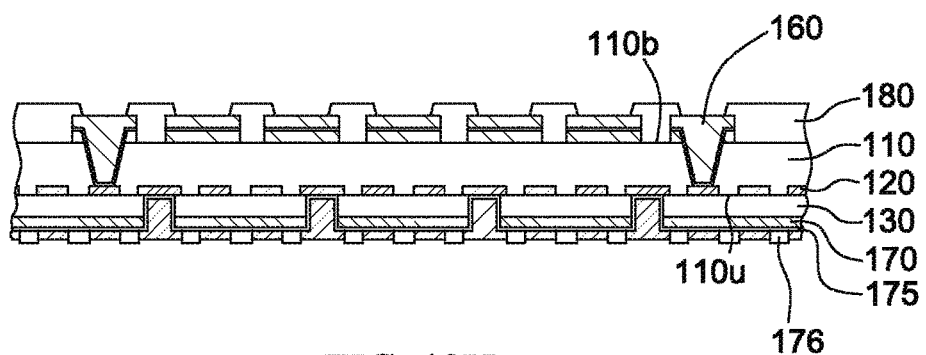
Figure 12I:
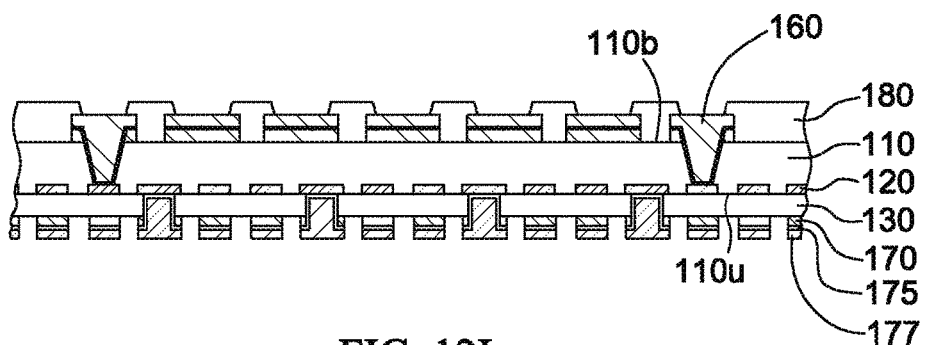

FIG. 12G to FIG. 12I illustrate the detailed steps to form first conductive posts 140 and input/output pads 150.

In FIG. 12G, a seed layer 175 is formed on the first protection layer 130 and in the inner side wall of the first holes 130a and the second holes 170a, by means of, for example, electroless plating.

In FIG. 12H, a photoresist layer 176 is formed on the seed layer 175 by coating, printing or any other suitable technique and predetermined or selected portions of the photoresist layer 176 are photoimaged and developed so as to create openings which expose a part of the seed layer 175. Then, a metal material 177 is applied on the exposed seed layer 175. The metal material may have similar characteristics to the material used for the input/output pad material 150' as disclosed above.

In FIG. 12I, after removing the photoresist layer 176, input/output pads 150 connected to first conductive posts 140 are formed, and an optional reinforcing layer 190 is formed.

As shown in 12G to 12I, first conductive posts 140 and input/output pads 150 are formed concurrently. Specifically, the input/output pads 150 and the respective first conductive posts 150 connected thereto are formed integrally as a conductive portion of the semiconductor substrate, thereby the strength of the input/output pads 150 and the first conductive posts 140 can be enhanced and the reliability of the semiconductor structure can be increased.

In summary, the present disclosure is described above through certain embodiments. However, these embodiments are not intended to limit the present disclosure. A person of ordinary skill in the art can make variations and modifications without departing from the spirit and scope. Therefore, the protection scope of the present disclosure shall be subject to the claims.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

What is claimed is:

1. A semiconductor substrate, comprising:
   a dielectric layer having a first surface and a second surface that are opposite to each other;
   a first circuit layer embedded in the dielectric layer and exposed from the first surface, the first circuit layer comprising a plurality of segments;
   a first protection layer covering a portion of the first circuit layer and defining a plurality of holes that expose a remaining portion of the first circuit layer, the first protection layer being a layer of solder resist, the first protection layer having a first surface that faces the first surface of the dielectric layer and a second surface that is opposite to the first surface of the first protection layer;
   a plurality of conductive posts formed in the holes; and
   a second circuit layer formed on the second surface of the first protection layer, wherein the second circuit layer comprises a plurality of input/output pads and each of the input/output pads is connected to the first circuit layer through a corresponding one of the plurality of conductive posts;
   wherein a surface of the first circuit layer exposed from the first surface of the dielectric layer does not protrude from the first surface of the dielectric layer; and
   wherein a pitch between two adjacent ones of the plurality of conductive posts is greater than a space between two adjacent ones of the segments of the first circuit layer.

2. The semiconductor substrate according to claim 1, further comprising:
   an electrical contact layer formed on the second surface of the dielectric layer; and
   a second protection layer covering the second surface of the dielectric layer and exposing a portion of the electrical contact layer.

3. The semiconductor substrate according to claim 2, wherein a ratio of a thickness of the first protection layer on the first circuit layer to a thickness of the second protection layer on the electrical contact layer ranges from 1.2 to 1.5.

4. The semiconductor substrate according to claim 1, wherein the segments of the first circuit layer comprise a plurality of first circuit layer pads, and for each of the plurality of first circuit layer pads: a width of the first circuit layer pad is no less than a diameter of a respective one of the plurality of conductive posts connected to the first circuit layer pad.

5. The semiconductor substrate according to claim 4, further comprising for each of the plurality of first circuit layer pads: a seed layer between the first circuit layer pad and the respective one of the plurality of conductive posts.

6. The semiconductor substrate according to claim 4, wherein the plurality of conductive posts and the plurality of first circuit layer pads are formed integrally.

7. The semiconductor substrate according to claim 1, wherein the input/output pads and the corresponding ones of the plurality of conductive posts are formed integrally.

8. The semiconductor substrate according to claim 1, wherein the surface of the first circuit layer exposed from the first surface of the dielectric layer is recessed from the first surface of the dielectric layer.

9. The semiconductor substrate according to claim 1, wherein the segments of the first circuit layer comprise a plurality of first circuit layer pads and at least one first circuit layer conductive trace, and wherein the at least one first circuit layer conductive trace is located between two adjacent ones of the plurality of first circuit layer pads.

10. The semiconductor substrate according to claim 1, wherein the second circuit layer further comprises at least one second circuit layer conductive trace positioned between two adjacent ones of the plurality of input/output pads.

11. The semiconductor substrate according to claim 10, wherein the segments of the first circuit layer comprise a plurality of first circuit layer pads and at least one first circuit layer conductive trace, and wherein a pitch between at least one of the plurality of input/output pads and an adjacent one of the at least one second circuit layer conductive trace is greater than a pitch between at least one of the plurality of first circuit layer pads and an adjacent one of the at least one first circuit layer conductive trace.

12. The semiconductor substrate according to claim 10, wherein the segments of the first circuit layer comprise at least one first circuit layer conductive trace, and a width of the at least one second circuit layer conductive trace is greater than a width of the at least one first circuit layer conductive trace.

13. The semiconductor substrate according to claim 1, wherein the segments of the first circuit layer comprise a plurality of first circuit layer pads and at least one first circuit layer conductive trace, and the first circuit layer pads of the first circuit layer and the at least one first circuit layer conductive trace of the first circuit layer are exposed from the first surface of the dielectric layer.

14. The semiconductor substrate according to claim 1, wherein the segments of the first circuit layer comprise a plurality of first circuit layer pads and at least one first circuit layer conductive trace, wherein the second circuit layer further comprises at least one second conductive trace located between two adjacent ones of the input/output pads, and wherein a pitch between one of the input/output pad and the at least one second conductive trace is greater than a pitch between one of the first circuit layer pads and an adjacent one of the at least one first circuit layer conductive trace.

15. The semiconductor substrate according to claim 1, further comprising a reinforcing layer disposed on the first protection layer and configured to reinforce a structural strength and reduce a warpage of the semiconductor substrate.

16. The semiconductor substrate according to claim 15, wherein the reinforcing layer includes at least one reinforcing structure extending along a path in the reinforcing layer.

17. The semiconductor substrate according to claim 1, wherein the segments of the first circuit layer comprise a plurality of first circuit layer pads and a plurality of first circuit layer conductive traces, and a pitch between two adjacent ones of the plurality of first circuit layer pads is greater than a line spacing between two adjacent ones of the plurality of first circuit layer conductive traces.

18. A semiconductor structure, comprising:
    a semiconductor substrate which comprises:

a dielectric layer having a first surface and a second surface that are opposite to each other, a first circuit layer embedded in the dielectric layer and exposed from the first surface of the dielectric layer, the first circuit layer comprising a plurality of segments, wherein a surface of the first circuit layer exposed from the first surface of the dielectric layer does not protrude from the first surface of the dielectric layer, a first protection layer covering a portion of the first circuit layer and defining a plurality of holes that expose a remaining portion of the first circuit layer, the first protection layer having a first surface that faces the first surface of the dielectric layer and a second surface that is opposite to the first surface of the first protection layer, a plurality of conductive posts formed in respective ones of the holes, and a second circuit layer formed on the second surface of the first protection layer, wherein the second circuit layer comprises a plurality of input/output pads and each of the input/output pads is connected to the first circuit layer through a corresponding one of the plurality of conductive posts; and a semiconductor element disposed over the semiconductor substrate, the semiconductor element comprising electrical connecting elements;

wherein a pitch between two adjacent ones of the plurality of conductive posts is greater than a space between two adjacent ones of the segments of the first circuit layer;

wherein the semiconductor element is coupled to the conductive posts of the semiconductor substrate through the electrical connecting elements; and wherein the electrical connecting elements of the semiconductor element are electrically connected to the first circuit layer through the input/output pads of the second circuit layer.

19. The semiconductor structure according to claim 18, wherein the second circuit layer further comprises at least one second circuit layer conductive trace located between two adjacent ones of the plurality of input/output pads.

20. The semiconductor structure according to claim 19, wherein the segments of the first circuit layer comprise a plurality of first circuit layer pads and at least one first circuit layer conductive trace, and wherein a pitch between one of the plurality of input/output pads and an adjacent one of the at least one second circuit layer conductive trace is greater than a pitch between one of the plurality of first circuit layer pads and an adjacent one of the at least one first circuit layer conductive trace.

21. The semiconductor structure according to claim 19, wherein the segments of the first circuit layer comprise at least one first circuit layer conductive trace, and a width of the at least one second circuit layer conductive trace is greater than a width of the at least one first circuit layer conductive trace.

22. The semiconductor structure according to claim 18, further comprising:
    an electrical contact layer formed on the second surface of the dielectric layer; and
    a second protection layer covering the second surface of the dielectric layer and exposing a portion of the electrical contact layer.

23. The semiconductor structure according to claim 22, wherein a ratio of a thickness of the first protection layer to a thickness of the second protection layer ranges from 1.2 to 1.5.

24. The semiconductor structure according to claim 18, wherein the semiconductor element is disposed over and is spaced from the semiconductor substrate by the electrical connecting elements.

25. The semiconductor structure according to claim 18, wherein the first surface of the dielectric layer faces the semiconductor element.

26. The semiconductor structure according to claim 18, wherein the first protection layer is a layer of solder resist.

* * * * *